(12) United States Patent
Gustat

(10) Patent No.: US 7,714,420 B2
(45) Date of Patent: May 11, 2010

(54) APPARATUS FOR CONTACTLESSLY COUPLING CHIPS

(75) Inventor: Hans Gustat, Frankfurt (DE)

(73) Assignee: IHP GmbH - Innovations for High Performance Microelectronics, Frankfurt (DE)

( * ) Notice: Subject to any disclaimer, the term of this patent is extended or adjusted under 35 U.S.C. 154(b) by 420 days.

(21) Appl. No.: 10/577,114

(22) PCT Filed: Oct. 28, 2004

(86) PCT No.: PCT/EP2004/012351
§ 371 (c)(1),
(2), (4) Date: Feb. 20, 2007

(87) PCT Pub. No.: WO2005/043482
PCT Pub. Date: May 12, 2005

(65) Prior Publication Data
US 2007/0245056 A1    Oct. 18, 2007

(30) Foreign Application Priority Data
Oct. 31, 2003   (DE)  ................................ 103 51 719

(51) Int. Cl.
  H01L 23/48    (2006.01)
  G08C 17/00    (2006.01)
  H04B 5/00     (2006.01)
(52) U.S. Cl. .......... 257/678; 257/E23.01; 257/E23.179; 257/698; 257/691; 257/686; 257/685; 257/724; 257/723; 257/728
(58) Field of Classification Search ............ 257/E23.01, 257/E23.179, 678, 698, 691, 686, 685, 724, 257/723, 728
See application file for complete search history.

(56) References Cited

U.S. PATENT DOCUMENTS 5,629,838 A    5/1997    Knight et al.

(Continued)

FOREIGN PATENT DOCUMENTS

WO    WO 2004/012265    2/2004

OTHER PUBLICATIONS

T. Mangold et al., "A multichip module integration technology on silicon substrate for high frequency applications," 4 pages.

(Continued)

*Primary Examiner*—Alexander O Williams
(74) *Attorney, Agent, or Firm*—Ware, Fressola, Van Der Sluys & Adolphson LLP

(57) ABSTRACT

A chip arrangement comprising a first chip having at least one first signal interface with first coupling elements arranged along a first line in a first number density and at least one second chip with at least one second signal interface with second coupling elements arranged along a second line in a second number density,
  where the first and second coupling elements permit contactless signal transmission between the first and second signal interfaces,
  where the two chips are so arranged relative to each other that coupling elements of the first and second signal interfaces can contactlessly transmit signals with each other,
  where the longitudinal extent of at least one of the signal interfaces along the line associated therewith is greater than the length of the overlap of the two longitudinal extents,
  and where one of the signal interfaces has a greater number density of coupling elements than the other.

22 Claims, 16 Drawing Sheets

U.S. PATENT DOCUMENTS

| | | | |
|---|---|---|---|
| 5,786,979 | A | 7/1998 | Douglass |
| 6,449,308 | B1 | 9/2002 | Knight, Jr. et al. |
| 6,496,889 | B1 | 12/2002 | Perino et al. |
| 6,500,696 | B2 | 12/2002 | Sutherland |
| 2004/0018654 | A1* | 1/2004 | Drost et al. ............... 438/17 |

OTHER PUBLICATIONS

N. Rinaldi et al., "U.C.A.N.'s ultra wide band system: baseband algorithm design," Apr. 2003, 6 pages.

O. Albert et al., "Low-power ultra-wideband radio testbed for short-range data transmission," 6 pages.

N. M. Khan et al., "Use of state-space approach and Kalman filter estimation in channel modeling for multiuser detection in time-varying environment," 5 pages.

A. L. Sigvartsen, "Inside the AMD Hammer microprocessor—AMD's next generation microprocessor architecture (Fred Weber)," Oct. 22, 2001, infosatellite.com/news, 15 pages.

D. Salzman et al., "Manufacturability of capacitively coupled multichip modules," IEEE Transactions on Components, Packaging and Manufacturing Technology—Part B, vol. 18, No. 2, May 1995, pp. 277-281.

D. Salzman et al., "Application of capacitive coupling to switch fabrics," IEEE 1994, pp. 195-199.

D. Salzman et al., "Capacitively coupled multichip modules," MCM '94 Proceedings, pp. 487-494.

M. F. Chang et al., "RF/wireless interconnect for inter- and intra-chip communications," Proceedings of the IEEE, vol. 89, No. 4, Apr. 2001, pp. 456-466.

J. D. Meindl et al., "Interconnecting device opportunities for gigascale integration (GSI)," IEEE 2001, pp. 23.1.1-23.1.4.

D. Salzman et al., "Capacitive coupling solves the known good die problem," IEEE 1994, pp. 95-100.

R. Yung et al., "Future trend of microprocessor design (invited paper)," ESSCIRC 2002, pp. 43-46.

M. Kuijk et al., "Integration of CMOS-VLSI and light emitting sources by capacitive coupling," Electronics Letters, Oct. 9, 1997, vol. 33, No. 21, 2 pages.

R. J. Drost et al., "Proximity communication," IEEE 2003 Custom Integrated Circuits Conference, pp. 469-472.

S. Mick et al., "4 Gbps high-density AC coupled interconnection (invited paper)," IEEE 2002 Custom Integrated Circuits Conference, pp. 133-140.

K. Kanda et al., "1.27 Gb/s/pin 3mW/pin wireless superconnect (WSC) interface scheme," ISSCC 2003/Session 10/High Speed Building Blocks/Paper 10.7, IEEE 2003 International Solid-State Circuits Conference, 10 pages.

* cited by examiner

APPARATUS FOR CONTACTLESSLY COUPLING CHIPS

CROSS REFERENCE TO RELATED APPLICATIONS

This application is for entry into the U.S. national phase under §371 for International Application No. PCT/EP2004/012351 having an international filing date of 28 Oct. 2004, and from which priority is claimed under all applicable sections of Title 35 of the United States Code including, but not limited to, Sections 120, 363 and 365(c), and which in turn claims priority under 35 USC §119 to German Patent Application No. 103 51 719.7 filed 31 Oct. 2003.

BACKGROUND OF THE INVENTION

1. Technical Field

The invention pertains to the field of connecting technology of electronic units. More particularly, the invention concerns a chip arrangement, a coupling component for contactless signal transmission between a first and a second chip, a chip for use in a chip arrangement, a wafer having a plurality of chip portions and a method of contactlessly coupling a first and a second chip together.

2. Discussion of Related Art

The demands on the connecting technology of electronic units are increasing due to rising clock rates. An example involving a very high level of significance is the communication between a processor and a main memory in computers. The interface between the processor and the main memory forms the essential bottleneck in terms of the growth of the computing power of the system. In the foreseeable future 64 bit processors with a clock rate of about 5 GHz are to be expected. They could service an interface to a main memory with a data rate of up to 320 Gbit/s.

One solution for the management of such high data rates would be to increase the internal cache memory of the processor to such an extent that at least during the execution of a thread there is always sufficient memory space available, in particular a block for interrelated code of usual size. It is thought that in this respect in the near future this will involve interconnected segments of some 10 B. A large internal cache will not be optimum in terms of surface area because of the technological demands for memories on a chip with a CPU. In addition the area of the memory considerably reduces the output of the processor overall.

An alternative solution involves providing a sufficiently powerful data path to external fast memory, for example in the form of SRAM (static random access memory). U.S. Pat. No. 6,496,889 B1 discloses a chip arrangement in which signals are sent from a first chip to a second chip by means of a capacitive coupling by way of a high-speed databus. For that purpose the housing in which the first and the second chip respectively is disposed is provided at the housing bottom with coupling elements in the form of metallically conductive strips. The housing is fitted on to a substrate which has a capacitively coupleable databus. The substrate also has metallic strips for coupling the signal in and out at the interfaces to the first and second chips. That enables a plurality of IC components to be arranged on the substrate and coupled together.

A disadvantage with the solution known from U.S. Pat. No. 6,496,889 B1 is coupling of the chips by way of a signal substrate which serves at the same time as a carrier for the chips and as a databus. That technology entails additional costs for production of the carrier. More specifically the signal substrate itself makes relatively high demands on the level of manufacturing accuracy so that it has to be manufactured with a technology which is close to the level of semiconductor technology. The price in relation to area of such a signal substrate is therefore relatively high.

The document K Kanda, D D Antono, K Ishida, H Kawaguchi, T Kuroda and T Sakurai, '1.27-Gbps/pin, 3 mW/pin Wireless Superconnect (WSC) Interface Scheme, 'IEEE ISSCC Digest of Technical Papers, February 2003 pages 186-187 discloses a chip arrangement in which chips are arranged in mutually superposed relationship. A first chip has coupling surfaces which are distributed over the entire surface of its underside and a second chip has coupling surfaces which are distributed over the entire surface of its top side, these being referred to as mini-pads. The mini-pads are approximately square with a side length of 20 µm. Their mutual spacing is also 20 µM. The chips are so arranged relative to each other that a capacitive coupling is afforded between mutually associated mini-pads. For that purpose the chips are laid one upon the other in such a way that mutually associated coupling surfaces lie one upon the other. To produce the capacitive coupling the associated pads are arranged at a spacing of between 1 and 2 µm relative to each other. The surface of the mini-pads is provided with an oxide layer. In that way it is possible to dispense with further structures for protecting against electrostatic discharge (ESD). Thus the capacitance of a pair of pads is reduced, which improves signal transmission. A data rate of 1.27 Gbit/s per pad with 3 mW power loss was achieved.

A disadvantage of the previously known chip arrangements is the difficulty of implementing exact positioning of the chips relative to each other. Inaccuracies in manufacture and a rise in temperature of a chip in operation also result in errors in the position of the mini-pads relative to each other.

It is precisely for processors however that the thermal load-carrying capability must be very high. In order to guarantee an adequate coupling effect that entails high minimum values in regard to the size of the electrodes. Large electrodes limit the data rate due to capacitive loading of the signal path and a reduction in the number of possible data paths.

In addition relatively large pads occupy a large part of the available chip area for contactless coupling. That means that the mechanical structure of the chip in the housing is dominated by contactless coupling. Particularly in relation to processors a large proportion of the chip area is as a rule required for conventional connections and for cooling. Therefore the provision for example of an additional contactless coupling with the main memory chip is not compatible with the conventional area requirements. Contactless coupling in addition to conventional connecting processes for signal transmission cannot therefore be used in the processor area.

In actual fact further previously known solutions therefore provide using capacitive coupling as a complete replacement for previous connecting procedures. See in that respect D B Salzman, T F Knight, 'Capacitively Coupled Multichip Modules', Proceedings of the 1994 International Conference on Multichip Modules, April 1994, pages 487-494, or D Salzman, T Knight, 'Capacitive coupling solves the known good die problem', Proceedings of the 1994 Multi-Chip Module Conference, 1994, pages 95-100, or D B Salzman, T F Knight, 'Manufacturability of capacitively coupled multichip modules', IEEE Transactions on Components, Packaging, and Manufacturing Technology, Part B: Advanced Packaging, Vol 18, No 2, May 1995, pages 277-281, or D Salzman, T Knight, P Franzon, 'Application of capacitive coupling to switch fabrics', Proceedings of the 1995 Multi-Chip Module Conference, 1995, pages 195-199, or S Mick, J Wilson and P Franzon, '4 Gbps High-Density AC Coupled Interconnection', IEEE 2002 CICC Digest of Technical Papers, May 2002, or K Kanda, D D Antono, K Ishida, H Kawaguchi, T Kuroda and T Sakurai, '1.27-Gbps/pin, 3 mW/pin Wireless Superconnect (WSC) Interface Scheme', IEEE ISSCC Digest of Technical Papers, February 2003, pages 186-187.

DISCLOSURE OF INVENTION

The object of the present invention is to provide a chip arrangement which does not suffer from the stated disadvantages and which in particular permits a simplification in horizontal positioning of the chips.

That object is attained by a chip arrangement, a coupling component, a chip, a wafer and a process for producing a chip arrangement as set forth below.

Preferred embodiments of the invention are recited in the appendant claims.

In accordance with a first aspect of the invention the object is attained by a chip arrangement comprising a first chip which has at least one first signal interface with first coupling elements arranged along a first line in a first number density and at least one second chip which has at least one second signal interface with second coupling elements arranged along a second line in a second number density, in which the first signal interface is provided along an edge of the first chip and the second signal interface is provided along an edge of the second chip, in which the first and second coupling elements are adapted to permit contactless signal transmission between the first and second signal interfaces, in which the first and second chips are so arranged relative to each other that coupling elements of the first and the second signal interfaces can contactlessly transmit signals with each other, wherein said edges of the first and second chips are arranged in mutually facing relationship, in which the longitudinal extent of at least one of the signal interfaces along the line associated therewith is greater than the length of the overlap of the two longitudinal extents, wherein said overlap is the distance which the projection of the first longitudinal extent on to the second longitudinal extent has in common with the second longitudinal extent, and in which one of the signal interfaces has a greater number density of coupling elements than the other.

In accordance with a second aspect of the invention the object is attained by a chip arrangement comprising a first chip which has at least one first signal interface with first coupling elements arranged along a first line in a first number density and at least one second chip which has at least one second signal interface with second coupling elements arranged along a second line in a second number density, and a coupling component which on a substrate has a coupling unit with third coupling elements arranged along a third line in a third number density and fourth coupling elements arranged along a fourth line in a fourth number density, wherein the third coupling elements are respectively electrically conductingly connected to the fourth coupling elements, in which the first signal interface is provided along an edge of the first chip and the second signal interface is provided along an edge of the second chip, in which the first, second, third and fourth coupling elements are adapted to permit contactless signal transmission between the first and second signal interfaces, in which the first and second chips and the coupling component are so arranged relative to each other that third coupling elements of the coupling unit and first coupling elements of the first signal interface and fourth coupling elements of the coupling unit and second coupling elements of the second signal interface can respectively contactlessly transmit signals with each other, wherein said edges of the first and second chips are arranged in mutually facing relationship, in which in respect of the longitudinal extents of the first and third coupling elements respectively in the spacing direction of the coupling elements along the line associated therewith, at least one of the longitudinal extents is greater than the length of the overlap of both longitudinal extents, in which in respect of the longitudinal extents of the second and fourth coupling elements respectively in the spacing direction of the coupling elements along the line associated therewith, at least one of the longitudinal extents is greater than the length of the overlap of both longitudinal extents, and in which the coupling component has a greater number density of coupling elements than the first or the second signal interface or the first and the second signal interfaces.

The chip arrangements in accordance with the first and second aspects of the invention are based on the approach of coupling chips with a very wide databus, that is to say far above 100 signals, with a very high number density, that is to say at least 40 signals per millimeter of the longitudinal extent of the signal interface, for signal transmission, without for that purpose requiring lateral positioning with levels of accuracy of 25 µm or below. Rather the level of positioning can even be markedly less precise than the pitch, that is to say the inverse of the number density. In addition, a large-area signal substrate with a high number density is not to be required for connection for that databus, but either no signal-carrying component additionally to the chips is used, or a coupling component with a coupling unit which involves a smaller area than the chip surfaces is involved. In that way the manufacturing costs of the chip arrangements according to the invention can be kept down, in comparison with known solutions.

The solution according to the invention permits particularly simple positioning in the manufacture of the chip arrangement with contactless signal transmission. At the same time the solution according to the invention makes it possible to achieve a high density of coupling elements, which requires a small surface area on the chip. In that way, besides contactless signal transmission between the first and second chips, the arrangement according to the invention can also involve conventional connecting technologies.

The solution according to the invention is based on the following considerations: so that coupling between the first and second interfaces for contactless signal transmission can be reliably effected in a simple fashion, one of the signal interfaces involves a greater number density of coupling elements than the other and one of the signal interfaces is of a greater longitudinal extent than the overlap of the two longitudinal extents. If the signal interfaces of the first and second chips are brought into such an overlap relationship, the solution according to the invention allows a certain lack of definition which is essential for a practical context in the positioning of the signal interfaces relative to each other. The higher number density of coupling elements on a chip allows the signal interfaces to be arranged relative to each other in a fashion in which the association of the first and second coupling elements is not predetermined. The higher number density of coupling elements should preferably be so selected that, in the case of any possible displacement of the signal interfaces relative to each other, nonetheless there is always at least one and preferably a plurality of coupling elements of the signal interface with a higher density, that involves a coupling with a coupling element of the signal interface with a lower number density of coupling elements. In relation to the chip arrangement according to the invention, it is no longer necessary for a given coupling element of the second chip to be brought into coincidence with a given coupling element of the second chip. That measure provides a high level of tolerance in terms of positioning of the first and second coupling elements relative to each other in the spacing direction.

For the sake of simplicity of representation it is assumed hereinafter that the second signal interface involves a greater number density of coupling elements than the first. It will be appreciated that the considerations entailed here equally apply when the conditions are reversed. For example, the spacing between two second coupling elements can be selected to be less than the widthwise extent of a first coupling element in the spacing direction of the second coupling element. In order to have sufficient leeway in terms of the positioning of the signal interfaces relative to each other, in accordance with the invention one of the signal interfaces in the longitudinal direction, that is to say along a line along which the coupling elements are arranged, is greater than the overlap of both longitudinal extents. By way of example, for that purpose, the one longitudinal extent can be greater than the other one. Preferably in that respect the signal interface which has a greater number density of coupling elements is also that which is of a greater longitudinal extent.

In that respect, in terms of success with contactless coupling between the first and second chips, it is not important whether a second coupling element or a plurality of second coupling elements are coupled to a first coupling element. It suffices for any, generally a plurality of, second coupling elements to be associated respectively with a first coupling element. Contactless signal transmission can therefore take place between on the one hand a respective first coupling element of the first signal interface and on the other hand at least one second coupling element, alternatively at least two second coupling elements, alternatively in part a second coupling element and in part at least two second coupling elements of the second signal interface.

In addition the second coupling elements can be narrower in their widthwise extent in the spacing direction than the spacing between the first coupling elements. That ensures that the second coupling elements do not implement any coupling between adjacent first coupling elements of one and the same chip.

In the case of the chip arrangement according to the invention, by virtue of those conditions, it is no longer important as to which second coupling element couples to which first coupling element, as long as in any case only a sufficient number of coupling elements of the first and second signal interfaces are respectively coupled to each other in order to achieve the desired databus width. An association of the signals transmitted by the coupling elements with the signals of the databus, optionally also with separation of the signals by signal processing, is made possible by means of additional units which are present on at least one of the chips.

The chip arrangement according to the invention is therefore distinguished by the fact that the components thereof can be positioned relative to each other in a simple fashion and with an adequate degree of precision. Positionability is simplified in particular in the spacing direction of the coupling elements, in comparison with previously known solutions. That is of significance in particular because the first and second coupling elements can be of a particularly narrow and dense configuration in the micrometer orders of magnitude. Such dimensions normally require highly precise positioning tools. In contrast the invention affords a quite substantial increase in ease of positioning of the chips of a chip arrangement. It is therefore possible to dispense with a high level of machine complication and expenditure for the positioning operation.

In the chip arrangement in accordance with the first aspect of the invention the first and second chips can without difficulty be so arranged relative to each other that contactless signal transmission can take place between a respective first coupling element and at least one second coupling element. Coupling is effected directly, without the involvement of a signal substrate or the like.

In the chip arrangement in accordance with the second aspect of the invention, a coupling component according to the invention is a carrier for the third and fourth coupling elements. For coupling together, by way of the component, the first and second chips have a first and a second signal interface respectively. In the case of the coupling component the coupling unit has a greater number density of coupling elements than the first or the second signal interface or than the first and the second signal interfaces. In addition the coupling unit is preferably of a greater longitudinal extent than the first or second signal interface or than the first and second signal interfaces. In addition to the features already referred to hereinbefore of the second coupling elements, the third and fourth coupling elements are electrically conductingly connected together on the coupling component, preferably in strip form, in order to bridge over the spacing between the first signal interfaces of the two chips. In a variant the third and fourth coupling elements can also be respectively so connected by strips that they respectively form a common coupling element. In both cases the strips are preferably arranged in mutually parallel relationship.

In this chip arrangement according to the invention the two chips can firstly be positioned relative to each other. The coupling between the first and second chips can then be implemented by positioning of the coupling component. In that situation positioning in the spacing direction is quite substantially facilitated by the higher density of second coupling elements in comparison with the density of first coupling elements on the first and second chips. Alternatively the chips can also be positioned on the coupling component. In that case the coupling component can also form in particular a part of the carrier for the chips.

Lateral positioning of the second coupling elements (with a higher number density) in a direction in perpendicular relationship to the spacing direction of the first coupling elements can be facilitated in both chip arrangements according to the invention by a strip-shaped configuration for the first coupling elements. The strip shape of the first coupling elements is however not imperative. It is also possible to provide first coupling elements of a different shape, for example a square shape, an oval or elliptical shape or a circular shape. In that case, a plurality of rows of first coupling elements can be provided in a matrix-shaped arrangement to facilitate positioning. If that matrix is arranged for example along an edge of a chip and a 'row' of the matrix extends along that edge, then a coupling element of a 'column' is sufficient for the coupling. A certain level of tolerance in terms of positioning also applies in that fashion in a direction in perpendicular relationship with the edge.

The chip arrangement according to the invention may include more than two chips. In that respect it can be provided that a signal interface of a first chip is adapted for contactless signal transmission with a plurality of chips. Those chips can each use a respective partial number of coupling elements of the signal interface of the first chip. For example, half of the coupling elements of the signal interface of the first chip can be used for contactless signal exchange with a second chip. The other half can be used for contactless signal exchange with a third chip. In such an arrangement, the first chip can have for example first coupling elements, that is to say coupling elements involving a lesser density. The second and the third chips then have second coupling elements, that is to say coupling elements of a high density. That arrangement corresponds to a chip arrangement in accordance with the first aspect of the invention. A chip can also have a plurality of such signal interfaces, for example one in the transmitting direction and one in the receiving direction, or a respective one to a further chip. Admittedly, such arrangements are more difficult to handle from the point of view of signal engineering and are therefore more complicated and expensive in operation, but they do afford the advantage of a particularly high packing density.

In a chip arrangement according to the second aspect of the invention with three chips, all three chips have first or second coupling elements. They are so arranged relative to each other that they can be coupled by means of the coupling component, which hereinafter is also referred to as the bridge. Alternatively two coupling components can be used. In that case, two signal interfaces can be provided on, the first chip, one of those signal interfaces being coupled to the second chip and the other being coupled to the third chip. In an alternative embodiment by way of example of a chip arrangement with three chips, the first chip is coupled to the second chip and the second chip is coupled to the third chip. These examples show that coupling of a plurality of chips in different configurations is broadly possible on the basis of the present invention.

The chip arrangement according to the invention is based on the use of novel signal interfaces. They can be exclusively provided on a chip, but alternatively they can be provided in addition to previously known coupling elements such as for example conventional bond pads.

A further advantage of the solution according to the invention in this context is that the signal interfaces according to the invention can be produced in particular with a density of coupling elements, which is very high in comparison with previously known solutions. Thus the pitch, that is to say the sum of the spacing and the width of the coupling elements, is of the order of magnitude of 10 µm in an embodiment in respect of the first signal interface. In alternative embodiments that dimension can be only 5 but also up to 25 µm. The order of magnitude of 10 µm which can be implemented without any problem for the pitch of the first signal interface is markedly less than the pitch of conventional bond pads and permits contactless coupling of chips by way of a wide database with a very high data throughput. Signal interfaces of that kind do not represent any problem in terms of chip manufacture. The contacting problems are also solved in manufacture of a chip arrangement, with the chip arrangement according to the invention as set forth by the first or second aspect thereof.

In an embodiment of the invention the first and second coupling elements are adapted to afford the contacts for signal transmission by means of capacitive coupling between a respective first and one or more second coupling elements. In that case the impedance of the capacitive connection must be sufficiently low relative to the minimum impedance between the conductor tracks and relative to the minimum impedances in relation to ground, so that attenuation over the entire connecting system can still be tolerated, from the point of view of the signal-noise ratio and cross-talk. That requirement for a sufficiently high passage capacitance can be satisfied if the first and second coupling elements bear sufficiently densely in planar relationship against each other.

An improvement in capacitive coupling is achieved if a filler with a high dielectric constant is arranged between the first and second coupling elements. The filler can form capacitive bridging in respect of gaps and irregularities.

The first and second coupling elements can then be protected by a thin insulating layer. That can be a thin passivation layer, a spontaneous or induced oxide layer or an additionally applied layer. When high numbers of items are involved, that has little or no influence on the manufacturing costs as the passivation layer already masks everything except the coupling elements so that the mask required for that purpose can be very coarse. It only has to separate regions of normal coupling elements from those of the first and second elements respectively according to the invention. The protection afforded by the insulation makes it possible to use substantially smaller ESD protection structures or no such structures at all so that there is a reduction in the parasitic capacitive loading, and that results in a greater bandwidth and a low power loss.

Alternatively contactless signal transmission can also be implemented by means of inductive, alternatively capacitive and inductive coupling. Contactless signal transmission can also assume the character of transmission by way of a radio path. In that case the coupling elements at the transmitter and receiver ends act like antennae. That kind of contactless signal transmission is referred to herein as electromagnetic.

In accordance with the invention the first signal interface is provided along an edge of the first chip and the second signal interface is provided along an edge of the second chip. Those edges of the first and second chips are in mutually facing relationship. In that case the edges can be arranged in mutually juxtaposed or mutually superposed relationship. Arrangement along an edge saves on space and leaves large proportions of the chip surface area freely available for other functions such as for example cooling or contacting using conventional procedures.

In an embodiment in accordance with the first aspect of the invention the second chip in that case is disposed at least partially on the first chip. The chips are directly contactlessly coupled to each other in that way. There is no need for a separate coupling component. The advantage of this arrangement is that the second coupling elements can be shorter in their longitudinal extent, than in the case of the arrangement with a coupling component. In such an arrangement the first chip (for example the processor) can be in the form of a flip chip.

In principle such an arrangement is also possible in relation to a chip arrangement in accordance with the second aspect of the invention, but it does require a special, more complicated and expensive configuration for the coupling component. For, in this case the coupling component is disposed between the chips and must couple to the one chip on its top side and to the other chip on its underside. The second coupling elements must therefore be provided on both sides of the coupling component and a coupling element of the top side must be connected to the corresponding coupling element of the underside. In the case of a coupling component in the form of a small plate portion that can be achieved for example by the coupling elements also being extended over a side edge of the coupling component from the underside to the top side.

In a further embodiment in accordance with the first aspect of the invention there is provided an arrangement of both chips on a carrier surface in mutually juxtaposed relationship. The coupling elements are so designed that they can be respectively coupled together by way of a side surface of the chip. That is effected for example by coils being arranged on the chips in such a way that their magnetic field passes through a side surface of the respective chip. Such coils with a horizontal axis in respect of the magnetic field can be produced in the metal system of chips, by using through-contacting means between the metal planes as perpendicular conductor tracks. That arrangement affords the advantage that further conventional coupling elements such as bond pads which are provided on a chip or on both chips can be easily contacted using conventional procedures.

In a preferred embodiment of the chip arrangement in accordance with the second aspect of the invention there is also provided an arrangement of both chips on a carrier surface in mutually juxtaposed relationship. By way of example both chips can have their coupling elements on the side which is remote from the carrier surface. The coupling elements of both chips are then arranged for example facing upwardly. It is important that the chips are properly matched in perpendicular relationship to the carrier surface (in the z-direction) so that the coupling component, the bridge, can rest approximately flat thereon.

In a preferred embodiment of the invention the number of coupling elements of the second signal interface, that is to say the signal interface with the higher number density, which in this embodiment is also of a greater longitudinal extent, relative to the number N1 of the coupling elements of the signal interface with the lower number density, can be represented as N2=g*N1+X. Therein g is a number>1 and X is the number of the coupling elements which are disposed in the overshooting lengthwise portion of the signal interface, which is of a greater longitudinal extent. If for example the first signal interface has N1=100 coupling elements in the 10 μm raster, the second signal interface over that width has 200 coupling elements in the 5 μM raster and moreover at each of the longitudinal side edges in addition 10 in each case, that is to say a total of 20, coupling elements at both edges, in order to accommodate coarse displacements, then that example provides g=2 and X=20.

In a further preferred embodiment the signal interface of that chip which in the signal flow between the first and the second chips forms a receiver (referred to hereinafter as the receiver chip) has coupling elements involving the higher number density. In that way signal transmission can be operated in a less complicated and expensive manner. As a connected transmitter is easier to detect than a connected receiver, it is appropriate for the chip with the increased number of second coupling elements to be provided at the respective receiver end.

In a preferred embodiment a reception selection circuit is provided on the chip which has a larger number of second coupling elements. The reception selection circuit, for each coupling element, has an input which is connected thereto, and it is adapted to ascertain inputs connected to active coupling elements, from input signals applied to its inputs, on the basis of predefined signal criteria, and to output only those input signals which are received from the active coupling elements.

Instead of recognition of signal activity, the selection criterion for an active coupling element can also be a signal with given recognition signs, for example a change in level with a given phase position relative to all other output signals. The edge of the signal vector can be uniquely characterised in that way.

In a preferred embodiment therefore the chip without an increased number of first coupling elements has a respective edge coupling element at the ends of its first signal interface and is adapted to apply a predefined edge signal to the edge coupling elements.

In a preferred embodiment, provided on the receiver chip is a filter circuit which is connected downstream of the signal interface and which is adapted to reconstruct signals emitted by coupling elements at the transmitter end, on the basis of the signals received by the coupling elements at the receiver end.

The filter circuit can operate predominantly in accordance with geometrical principles or predominantly in accordance with a signal-agreeing principle or in accordance with a hybrid form of both. In the case of a filter circuit which is designed predominantly in accordance with geometrical selection of the coupling elements at the receiver end, the filter circuit has a number of weighting elements which are respectively adapted to multiply signals received by a plurality of coupling elements at the receiver end by variable weighting factors and to add the signals which are weighted in that way.

In that respect, a preferred embodiment provides that the coupling elements at the receiver end are connected to a plurality of weighting elements. The total number of the weighting elements is preferably equal to the number of coupling elements provided at the transmitter end. The weighting elements therefore serve for reconstruction of the separation of the transmission channels formed by the transmitter coupling elements.

Preferably there is provided a control unit which is connected to the coupling elements and the filter circuit and which is adapted to determine the weighting factors. The control unit for example can be adapted to compare for each weighting element the signals received at the coupling elements at the receiver end, which are connected to the filter, to a respective predefined signal pattern and to associate with each of the coupling elements a respective weighting factor which is dependent on the comparison result.

In a simple embodiment the control unit is adapted for each weighting element to associate a weighting factor which is different from zero at a maximum with one to three coupling elements, in such a way that the total of all weighting factors per weighting element is 1.

In an embodiment which is designed predominantly from the aspect of signal processing, the filter circuit additionally or alternatively has a number of filter banks, wherein each filter bank is connected at the input side to a number of coupling elements. Preferably each filter bank has a number of filters, each of which is connected at the input side to a coupling element. In that arrangement each filter is adapted for example to deliver an output signal which depends on a weighted sum of the current signal at its input and a number of preceding signals in respect of time at its input. Preferably therefore the output signal of a filter of that kind is to be determined in accordance with the following formula:

$$A(z) = \sum_{j=1}^{r} S(j) \cdot w(j, z)$$

wherein S(j) is a signal applied to a filter input in a time step j, r is the total number of the time steps considered, w is a weighting factor which is dependent on the respective time step j and z is an index identifying the filter. Such a filter has for example a signal delay line with r-delay elements, r-multipliers and an adder. Connected downstream of each delay element except for the last in parallel relationship are a multiplier and a delay element. A multiplier is obviously connected downstream of the last delay member. The outputs of the multipliers are connected to parallel inputs of the summing unit.

Preferably each filter bank has a weighting unit which is connected downstream of the filters and which is adapted to multiply signals received by the filters of the respective filter bank by variable weighting factors and to add the signals which are weighted in that way. The operation of determining the weighting factors is preferably again effected with a control unit. The control unit is preferably adapted in a training phase to subject the signals applied to the coupling elements at the receiver end to correlation with one or more known signal patterns and, on the basis of the correlation result, to determine the weighting factors of the filters and the weighting circuit. The weighting factors of the filters are different from those of the weighting circuit.

In accordance with a third aspect of the invention there is provided a coupling component for contactless signal transmission between a first and a second chip in a chip arrangement according to the second aspect of the invention.

The coupling component according to the invention has a substrate and thereon a coupling unit. The coupling unit has third coupling elements arranged along a third line with a third number density and fourth coupling elements arranged along a fourth line with a fourth number density, wherein the third coupling elements are respectively electrically conductingly connected to the fourth coupling elements.

The number density of those coupling elements is higher than that of the coupling elements provided on one or both chips to be coupled. The coupling component according to the invention is markedly simplified in relation to conventional signal substrates and permits a flexible arrangement for contactless signal transmission. For example the coupling component can be applied to two mutually juxtaposed chips. Alternatively it is equally possible for the coupling component to be in the form of part of a carrier for the chips to be coupled. In that case the second coupling components only have to be provided in a predetermined portion. The chips can then be applied with their first contact elements facing downwardly to the coupling component and positioned thereon.

Preferably the spacing of the third coupling elements from each other in a direction in perpendicular relationship to the longitudinal direction of the strip is less than the width of first coupling elements provided at the chip side and the widthwise extent of the second coupling elements in the spacing direction is less than the spacing of the first coupling elements provided at the chip side from each other.

In a further preferred embodiment of the coupling component according to the invention the spacing of the third or fourth coupling elements and the widthwise extent thereof are so selected that a third or a fourth coupling element and the spacing relative to an adjacent third or fourth respective coupling element assume overall a maximum of 10 µm, particularly preferably only 5 µm. Such a pitch does not represent any problem in manufacture, but it does afford the possibility of signal transmission with a high throughput in a small space.

In a further embodiment the pitch is even only at a maximum 2.5 µm. Preferably the spacing of the third coupling elements is greater than their widthwise extent.

Further embodiments of the coupling component according to the invention will be apparent from the description of the chip arrangement according to the invention in accordance with the second aspect of the invention.

In accordance with a fourth aspect of the invention there is provided a chip for use in a chip arrangement in accordance with the first or the second aspect of the invention. The chip according to the invention has a first signal interface for contactless signal transmission. The first signal interface has first coupling elements arranged along a first line in a first number density. Alternatively there is provided at least one second signal interface with second coupling elements arranged along a second line in a second number density. As a further alternative there are provided at least a first and at least a second signal interface. The first and optionally the second signal interface is arranged along an edge of the chip. The coupling elements are preferably electrically conductive strips arranged in mutually parallel relationship.

The second chip can be used in a chip arrangement according to the first aspect of the invention if it has a first or a second signal interface or both types of signal interfaces. The chip according to the invention can be used in a chip arrangement according to the second aspect of the invention if it has a first signal interface. It will be appreciated that a chip may have a plurality of signal interfaces in accordance with the invention.

Arranging the signal interface along an edge of the chip according to the invention affords a space-saving possible way of using the chip arrangement according to the invention beside alternative connection procedures. Depending on the respective number of the first and second coupling elements and the pitch selected, an entire edge length or only a portion of an edge is required for a signal interface.

Positioning of a second chip or a coupling component on the chip surface is made easier in an embodiment in which the chip has a reference edge. This can involve a saw edge of the chip, for example the upper edge. In that case the chips can be positioned relative to each other by means of an upper abutment. Without the tolerance according to the invention in relation to positional inaccuracies due to redundant coupling elements, that would presuppose that the spacing of the coupling elements relative to the reference edge can be defined with an error markedly below half a pitch, that is to say for example with 1 µm tolerance. Individually separating chips with such a degree of accuracy however is difficult. In general post-working will be required. That means that the manufacture of a chip for the chip arrangement according to the invention becomes a complicated and expensive piece of precision work. The tolerance according to the invention in relation to positional inaccuracies by virtue of redundant coupling elements however provides that the tolerance can be much greater, for example 50 µm. In that way a saw edge can certainly serve as a reference edge.

It is more precise for a lithographically applied structure to be used as a reference edge as that can involve a much higher degree of accuracy than a saw edge. The lithographic structure could be a layer which can be sufficiently thickly applied to afford useful mechanical guidance. In this embodiment, in a chip arrangement in accordance with the second aspect of the invention, the coupling component itself can serve with an edge as a reference, in relation to which the two chips are oriented relative to each other. For that purpose the coupling component itself must have a precise, straight and orthogonal edge. Therefore it cannot comprise in particular stretchable material. For example a narrow silicon strip would be suitable. Alternatively an additional rigid object can be provided at another location for mechanical adjustment purposes. In that case the coupling component can also be mechanically flexible.

In order to avoid adjacent coupling elements being coupled together, a preferred embodiment of the chip according to the invention provides between the first coupling elements metal elements which are respectively connected to ground. Preferably the metal elements are in the form of metal strips which are provided in all metal planes of the chip and are connected in terms of signals to ground. In order to avoid coupling by way of the chip substrate a delimiting, conducting layer is preferably also arranged towards the substrate, that layer being connected to ground. That layer can be for example the lowermost conductor layer, metal 1. In this embodiment each coupling element is surrounded by a separate U-shaped profile which separates it electromagnetically from its neighbors.

Various measures are possible for achieving a particularly high level of density for the coupling elements, even if cross-talk obstructs separation of the signals at the receiver end.

In a preferred embodiment of the chip according to the invention it has a transmitter control which is adapted to output signals on adjacent first or second coupling elements with a predetermined phase shift relative to each other. An example in this respect is as follows:

For each transmitting coupling element, the data rate is a gigabit per second. In that case accordingly the data spacing is a nanosecond. The transmitter control produces modulation by binary phase shift keying at a carrier frequency of two GHz. In this case transmitting amplifiers are used, which produce pulses with a rise time of a maximum of 50 ps. In this case a main clock is transmitted at another frequency such as for example 20 GHz. 20 sub-clocks of 1 GHz with a 50 ps phase displacement are derived at the receiver end. The respective signal suiting the sub-clock is selected from the received signal mixture by means of time windows or a correlation procedure and restored.

It is also possible to use further methods which are known from radio systems, in particular those which are known in the area of ultra-wideband (UWB) systems. Both the range of the data rate and also the possible carrier frequency can be very similar in chip-to-chip coupling to the values of the UWB standards which apply at the present time at between 3 and 10 GHz. Because of the constant channel conditions however transmission in the present system is simpler than in the case of radio systems.

Many of the measures proposed here require an automatic adjustment phase before operation is possible. The adjustment phase can be effected once, for example when switching on, or regularly at given time intervals. As the transmission conditions are time-invariant to a first approximation, an adjustment phase is only rarely required. It will be noted that temperature alterations can require adaptation. A large part of the components required for adaptation can then be switched off, and only the filters are active.

In accordance with a fifth aspect of the invention there is provided a wafer for the production of a chip in accordance with the fourth aspect of the invention, with a plurality of chip portions, wherein at least one chip portion has the features of a chip according to the fourth aspect of the invention. The wafer therefore forms an intermediate product in the production of a chip according to the invention or a chip arrangement according to the invention.

In accordance with a sixth aspect of the invention there is provided a process for producing a chip arrangement according to the invention, comprising the following steps:
a) positioning the first chip on a carrier,
b) positioning the second chip relative to the first chip on the carrier, and
c) positioning a coupling component as in any of the above aspects of the invention, for producing a contactless coupling for signal transmission between the first and second chips.

BRIEF DESCRIPTION OF THE DRAWINGS

The above and other objects, features and advantages of the invention will become apparent from a consideration of the subsequent detailed description presented in connection with accompanying drawings, in which.

DETAILED DESCRIPTION

Figure 1:
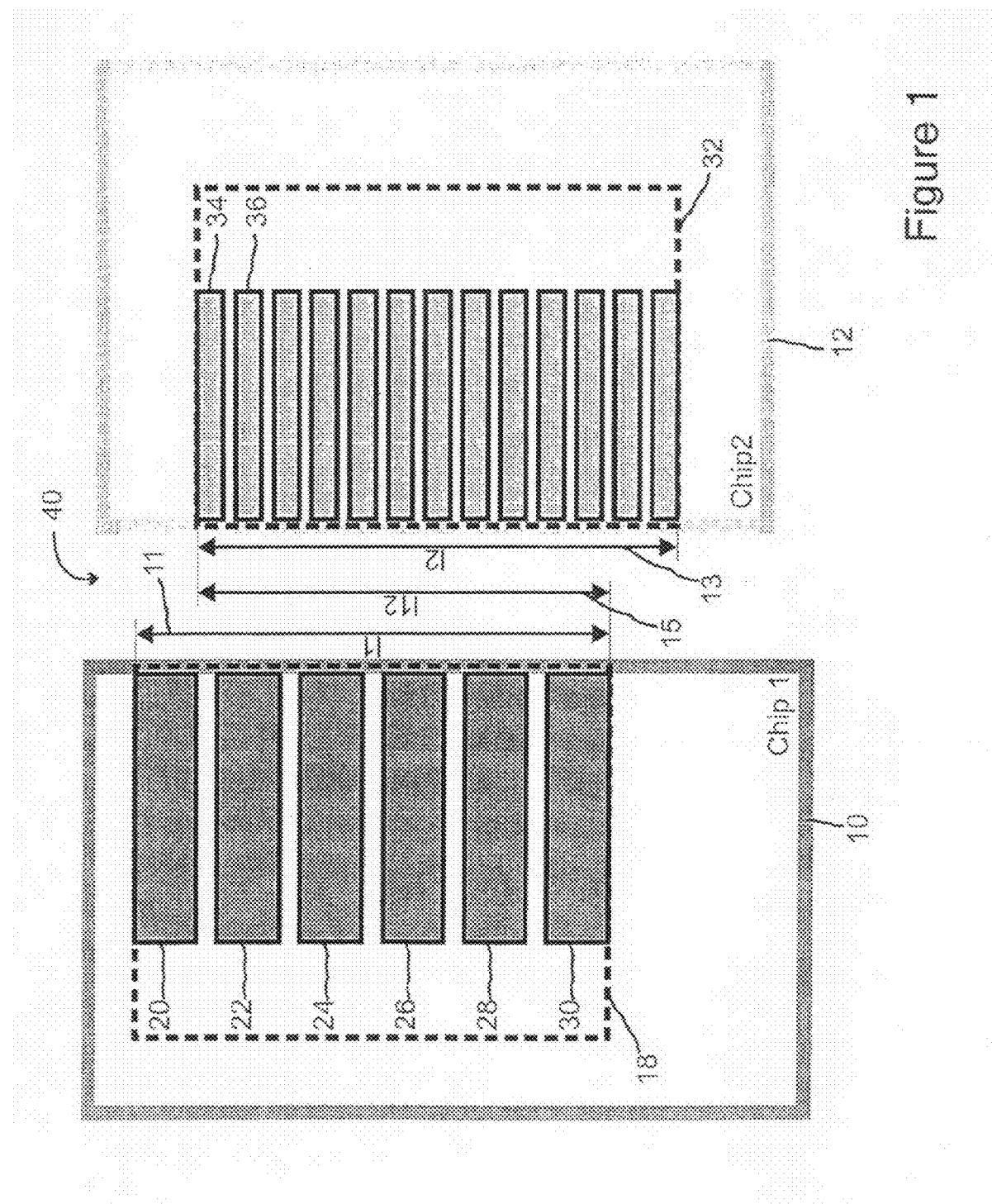
FIG. 1 shows a first embodiment of a chip arrangement.

FIG. 1 shows an abstract diagrammatic view of a first embodiment of a chip arrangement according to the invention. Two chips 10 and 12 are shown in a diagrammatic plan view. The first chip 10 has a first signal interface 18 with a plurality of coupling elements and of a first number density. Only a few coupling elements 20 through 30 are shown here to simplify the illustration. The number density is the number of coupling elements per longitudinal extent of the signal interface. That longitudinal extent 11 of the interface 18 is of the length 11 in FIG. 1. Disposed in opposite relationship to the signal interface 18 of the first chip 10 on the second chip is a second signal interface 32 with coupling elements which are arranged in a higher number density than the coupling elements 20 through 30 of the signal interface 18. The size relationships are not true to scale in the diagrammatic view in FIG. 1. In the normal case the signal interfaces 18 and 32 respectively will occupy only a small part of the respective chip surface and the chips can have further elements at the surface, for example conventional bond pads. The coupling elements are symbolically shown in FIG. 1 in the form of rectangles with a gray filling. In a real configuration the shape of the coupling elements may be different. They can also be three-dimensional structures, for example coils. The lengthwise extent 13 of the signal interface 32 is of the length 12 in FIG. 1. For the sake of simplicity of the drawing, only two coupling elements 34 and 36 are denoted by references. The coupling elements of both signal interfaces are arranged along the edge of the chips, which is towards the respective other chip. The overlap 15 of both longitudinal extents 11 and 13 is of the length 112 in FIG. 1. If the first longitudinal extent 11 is projected on to the line of the second longitudinal extent 13, the common region which the resulting projected distance has with the second longitudinal extent 13 forms the distance of the overlap 15. The first chip 10 and the second chip 12 are so arranged relative to each other that coupling elements of the first signal interface 18 and coupling elements of the second signal interface 32 can contactlessly transmit signals with each other. In the illustrated case the coupling elements can be for example horizontal coils, that is to say inductors, whose longitudinal axes of the magnetic field are arranged in a horizontal plane in parallel relationship with the surface of the chip. In FIG. 1 those longitudinal axes are respectively parallel to the longer side of each coupling element and thus perpendicular to the edge of the chip, which is towards the other chip. In spite of the displacement, which is visible in FIG. 1, of the signal interfaces 18 and 32 relative to each other, in the region of the overlap 15 there are coupling elements of the signal interface 18 of the first chip 10, which couple with coupling elements of the signal interface 32 of the second chip 12. In the example of the structure of the coupling elements in the form of horizontal coils, the one coupling is in respect of the magnetic fields of inductors of the signal interface 18, which interact by way of the intermediate space 40 with inductors of the signal interface 32 on the other chip. In that case, a coupling element or also a plurality of coupling elements of the signal interface 32 of the second chip 12 can be associated with a coupling element of the signal interface 18 of the first chip 10. By way of example all coupling elements of the signal interface 18 can be actuated as transmitters and all coupling elements of the signal interface 32 as receivers. Further measures such as selection circuits and filters, for example connected downstream of the receivers, provide for associating and reconstructing the transmitted signals. As accordingly the association of the individual coupling elements of the signal interface 18 with the coupling elements of the signal interface 32 can be flexibly adapted to the real position, there is a high level of tolerance in relation to a displacement of the chips in the direction of the longitudinal extents 11 and 13. That simplifies positioning of the chips with respect to each other.

Figure 2:
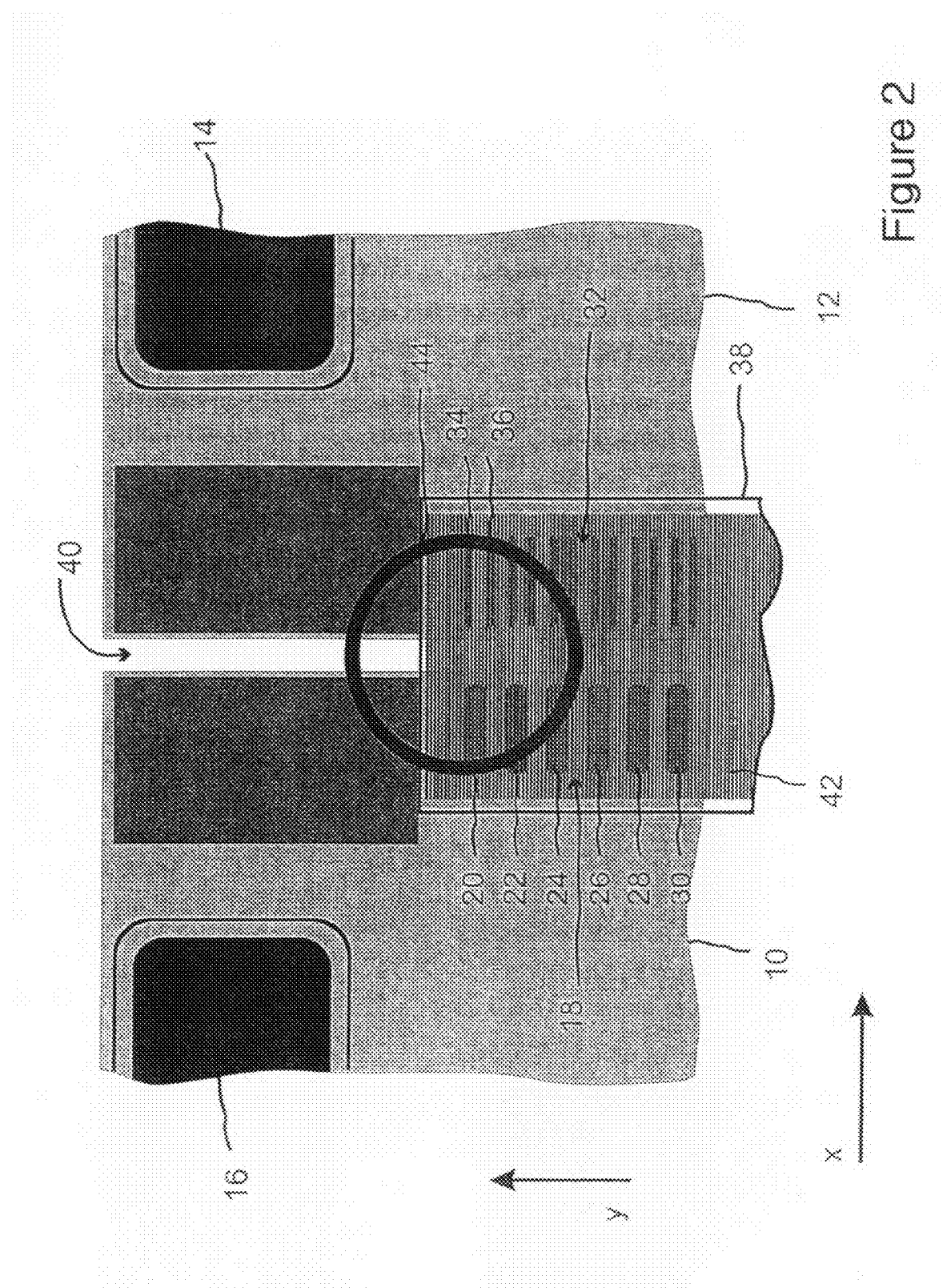
FIG. 2 shows a second embodiment of a chip arrangement.

FIG. 2 shows a second embodiment of a chip arrangement according to the invention. Here the same references have been used for corresponding elements as in FIG. 1. In this case also two chips 10 and 12 are shown as a diagrammatic plan view. The chips 10 and 12 have conventional bond pads 14 and 16. Furthermore the first chip 10 has a first signal interface 18 with a plurality of coupling elements, of which only the coupling elements 20 through 30 are illustrated here. In the description of the Figure the directions x and y which are illustrated in FIG. 2 by means of arrows are used throughout for the lateral directions in the chip surface. A z-direction which is not yet shown here faces in the depth direction of the chips in perpendicular relationship to the chip surface and thus in perpendicular relationship to the plane of the paper. Disposed in opposite relationship to the signal interface 18 of the first chip 10, on the second chip, is a second signal interface 32 having coupling elements which are arranged in a higher number density in the y-direction than the coupling elements 20 through 30 of the signal interface 18. For the sake of simplicity of illustration only two coupling elements 34 and 36 are provided with references. The coupling elements of both signal interfaces are arranged along the edge of the chips, which in FIG. 2 extends parallel to the y-direction. The coupling elements are in the form of strips, the longitudinal direction of which is parallel to the x-direction. The coupling elements of the first signal interfaces 18 clearly visibly are of a greater width in the y-direction than that of the second signal interface 32 of the chip 12. The signal interfaces 18 and 32 of the two chips 10 and 12 are connected for signal transmission by way of a coupling component 38. The coupling component rests on both chips in the region of their mutually facing edges and covers over the signal interfaces 18 and 32. The coupling component 38 has a large number of third and fourth coupling elements which in this case are respectively connected to constitute unitary coupling elements in strip form which extend in the x-direction from beyond the coupling elements of the signal interface 18 beyond an intermediate space 40 between the chips, to beyond the coupling elements of the signal interface 32 of the chip 12. In the y-direction the coupling strips of the coupling component 38 are of a higher number density and a markedly smaller width in comparison with the coupling elements of the two chips. The coupling strips of the coupling component 38 are shown as being gray in FIG. 2. One coupling strip 42 is identified by way of example. FIG. 2 also includes a ring 44 which serves solely to clearly show the scale of the Figures described hereinafter.

If an edge length of between about 10 and 25 mm which can be used as a maximum for the signal interfaces 18 and 32 and a number of between about 1000 and 2000 coupling elements required for the maximum throughput are adopted as a basis, that gives a pitch of the order of magnitude of between 5 and 25 µm per coupling element.

Figure 3:
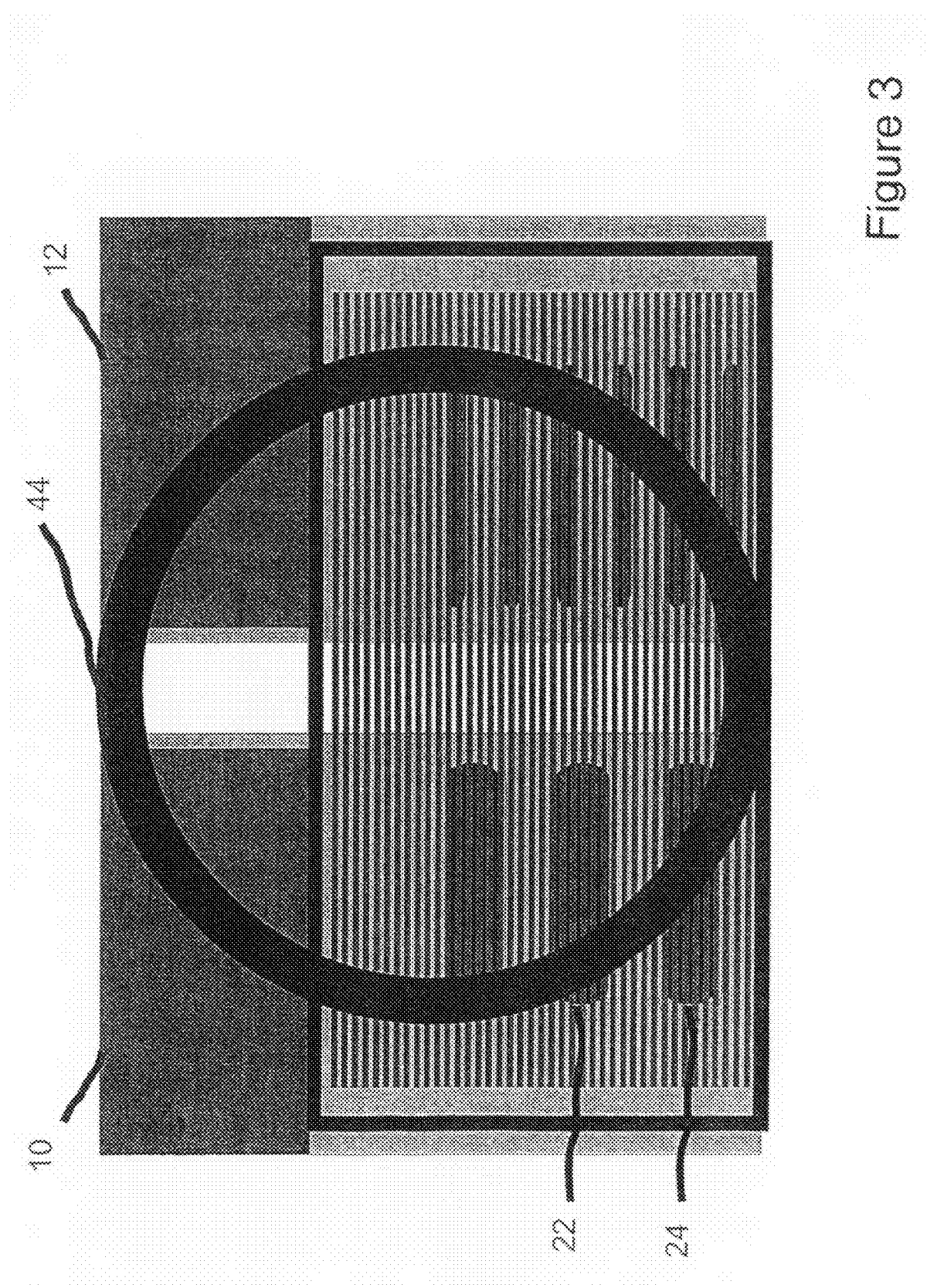
FIG. 3 shows the embodiment of FIG. 2 on a larger scale.

FIG. 3 shows a portion of the embodiment of FIG. 2 on an enlarged scale. Here, as in FIGS. 2, 4 and 5, the coupling component is illustrated as being transparent only for the purposes of description. By way of example the coupling elements 20 through 30 of the signal interface can have a pitch of 10 µm and the coupling elements of the signal interface 32 can have a pitch of 5 µm. If for example there are 1000 coupling elements on the chip 10 and 2500 coupling elements on the chip 12, then the longitudinal extent of the signal interfaces on the chips is 10 mm and 12.5 mm respectively. If all 1000 coupling elements on the chip 10 are to be used, then the overlap of both longitudinal extents must include the total longitudinal extent of the chip 10. That overlap is then also 10 mm long. If the chips are so positioned in the y-direction relative to each other that at the reference value the signal interfaces are precisely central relative to each other, a displacement of the signal interfaces relative to each other by that reference value in the y-direction of 0.5*(12.5−10) mm can be tolerated, that is to say 1.25 mm, upwardly or downwardly in FIG. 3. Which coupling element of the chip 10 reaches which coupling element of the chip 12 must be established after the positioning operation, for example automatically when switching on the system, by chip 10 applying an easily recognisable sequence in succession to all its coupling elements, and by chip 12 finding out the coupling elements on which reception is respectively best for the respective coupling element of the chip 10. In that case only those 1000 of the 2500 coupling elements of the second chip are then used in operation. If the displacement is even greater and the coupling elements (translation note: portion of text missing here). The others are then deactivated, unless they are additionally used for selective signal recovery (see below).

Figure 4:
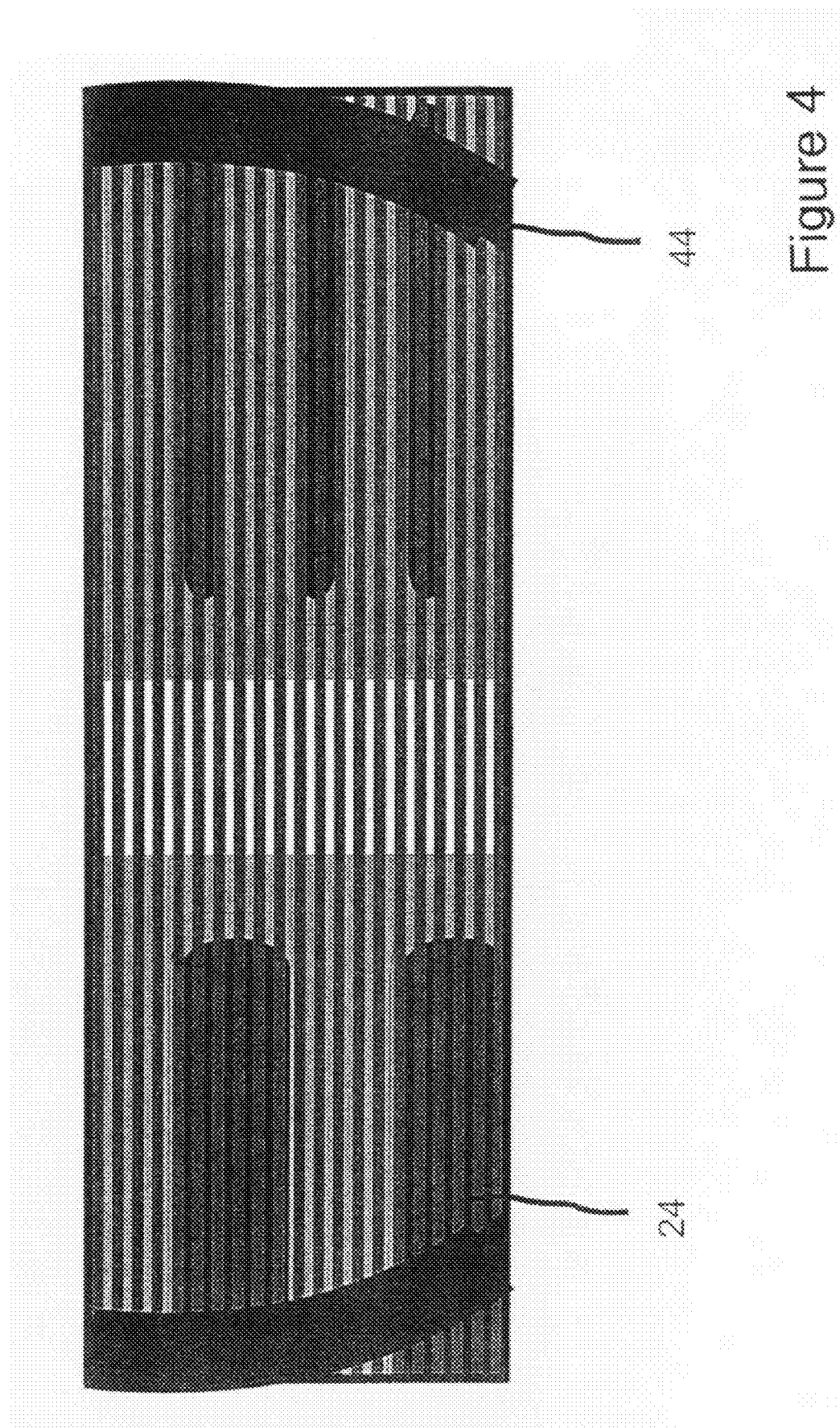
FIG. 4 shows the embodiment of FIG. 2 on a further enlarged scale.

FIG. 4 shows the embodiment of FIGS. 2 and 3 on a further enlarged scale. It is not necessary for more receivers and fewer transmitters to be used. The relationship can also be reversed.

Figure 5:
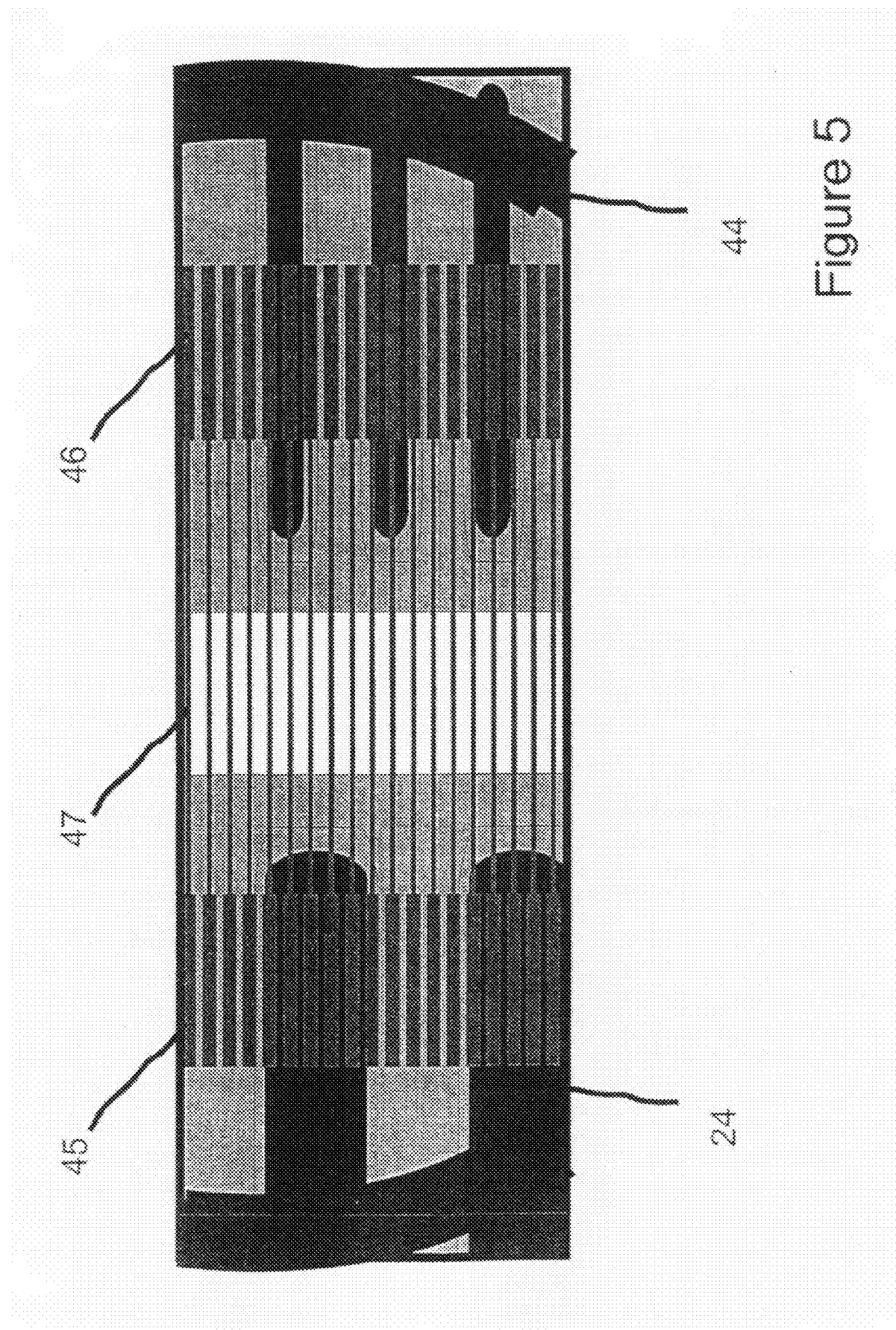
FIG. 5 shows a modification of this embodiment.

FIG. 5 shows a modification of this embodiment. In this case the connections 47 between the third coupling elements 45 and the fourth coupling elements 46 of the coupling component are narrower than the width of the coupling elements 45 and 46. That can be advantageous in order to reduce unwanted capacitances in the signal path. In that way on the one hand the relationship of unwanted passage capacitance to unwanted load capacitance is increased, while on the other hand cross-talk between the connections 47 is reduced.

A further measure for reducing cross-talk, which is not shown in FIG. 5, can involve the application of metallic screenings between the connections 47, which can also enclose those connections 47 respectively at all longitudinal sides. In addition the coupling elements 45 and 46 can also be enclosed thereby, except for the area required for coupling.

Figure 6:
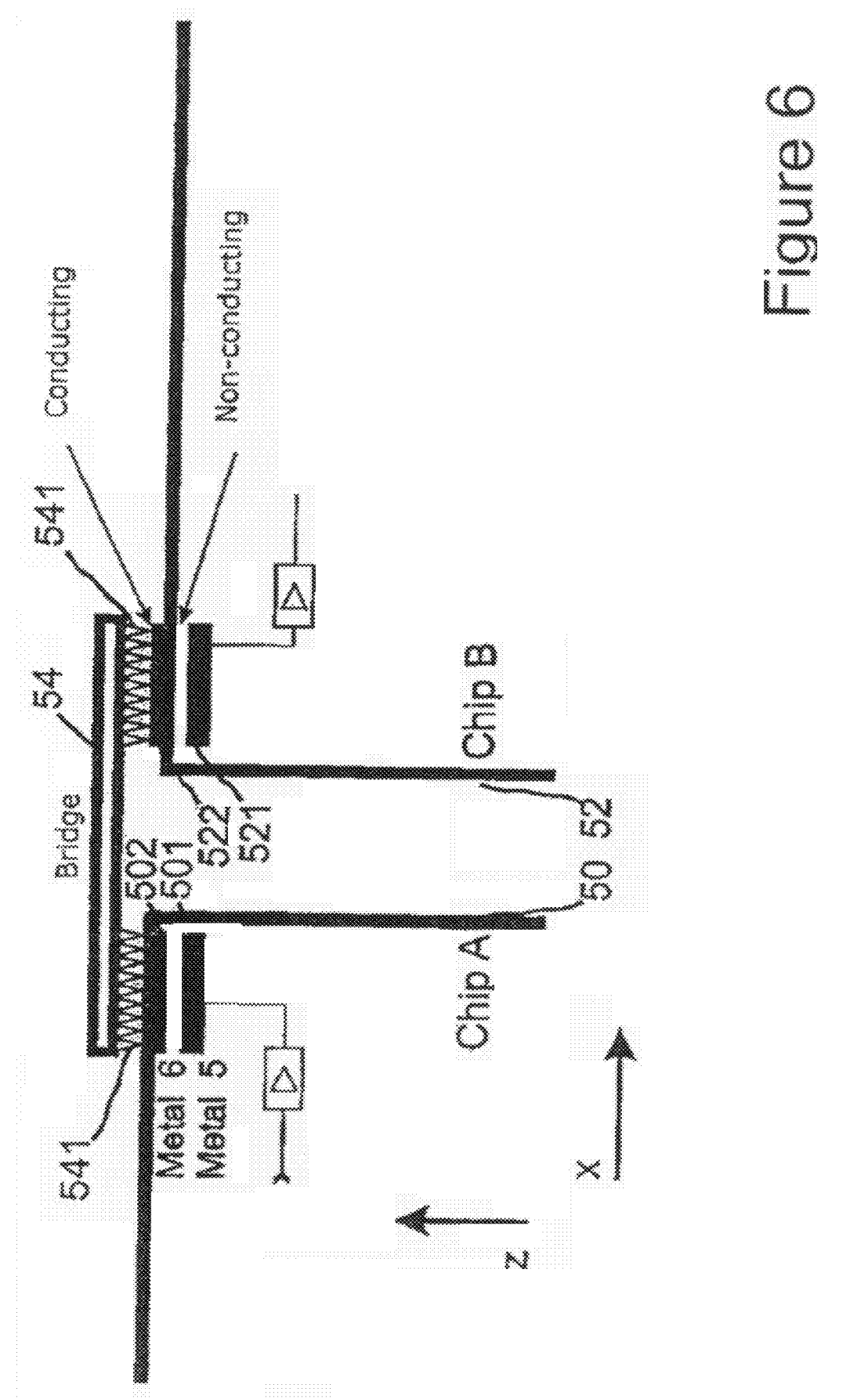
FIG. 6 shows a diagrammatic cross-sectional view of a third embodiment of a chip arrangement according to the invention.

FIG. 6 shows a third embodiment of a chip arrangement with two chips 50 and 52 which in FIG. 6 are also identified as chip A and chip B. The chips are connected together for signal transmission by way of a coupling component 54. In this case, contactless coupling already takes place within the respective chips, more specifically between the metallic conductors 501 and 502 for chip 50 and 521 and 522 for chip 52 respectively. In that way the external connection between the chips can also be an electrically conducting connection without the internal structure of the chips 50 and 52 requiring ESD protection as in the case of conventional contacting. The coupling component 54 is provided with contact surfaces 541 which are toothed or stepped. It is possible in that way for surface roughnesses and dust particles on the contact surfaces of the chips to be better tolerated.

Figure 7:
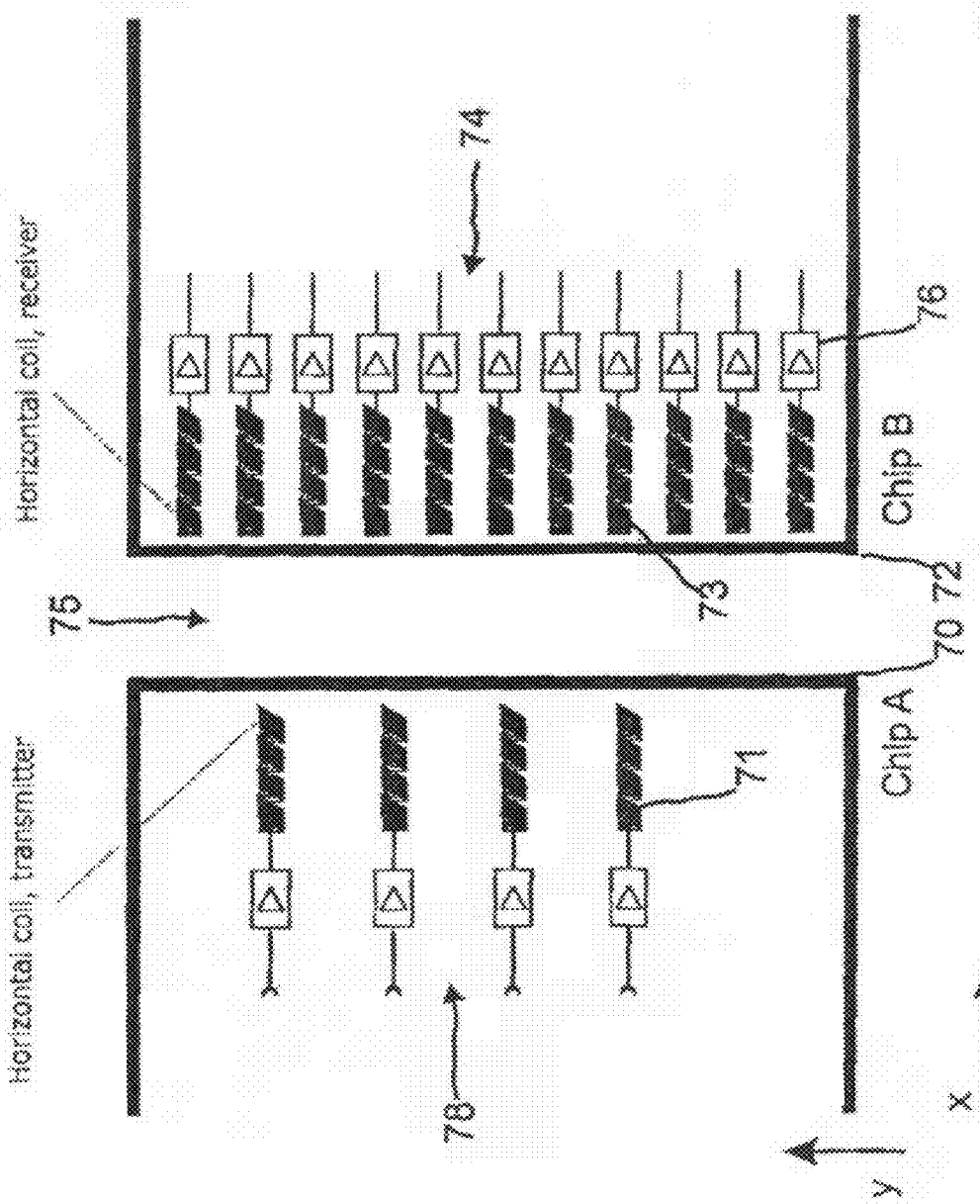
FIG. 7 is a diagrammatic plan view of a fourth embodiment of a chip arrangement according to the invention.
Figure 8:
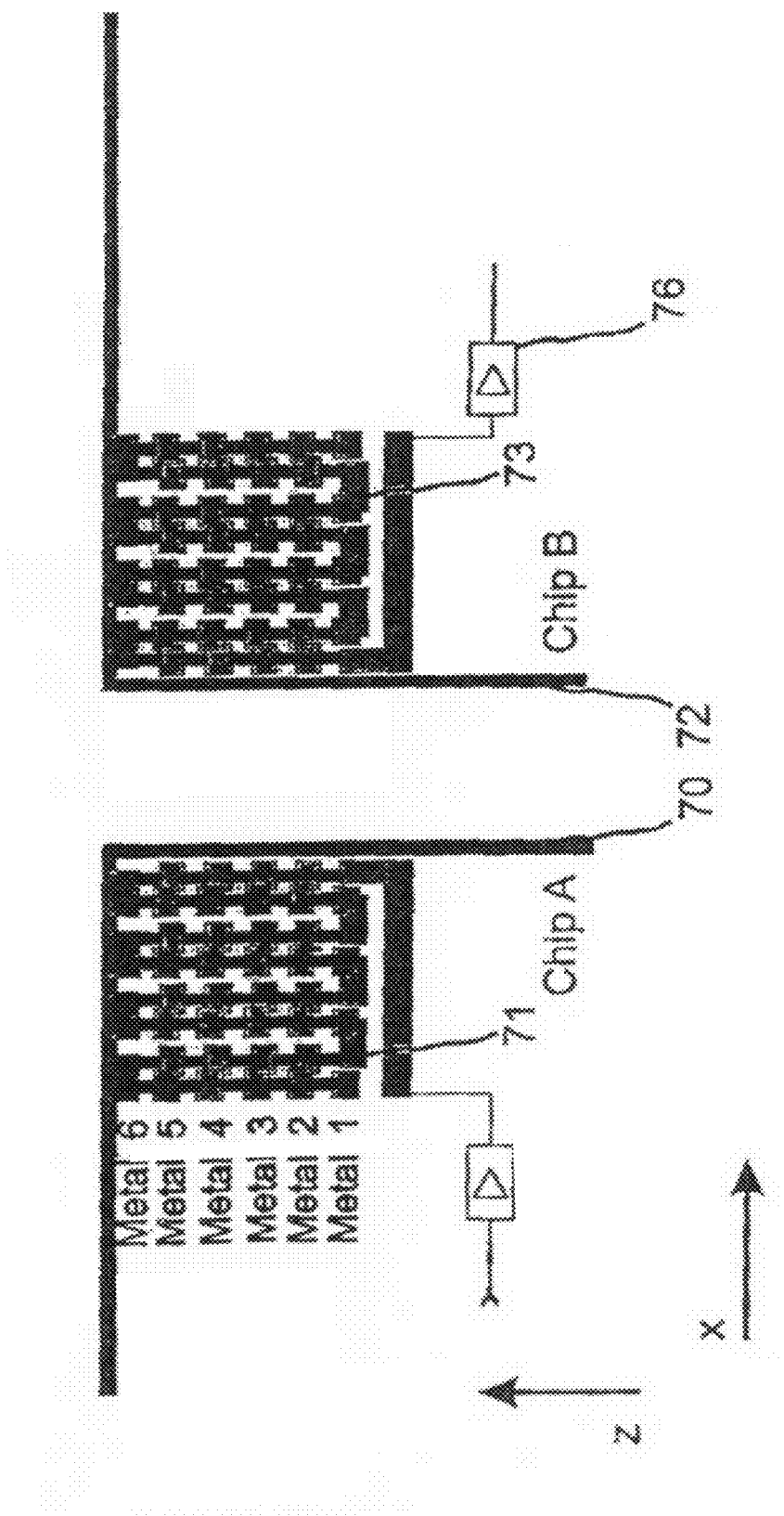
FIG. 8 is a diagrammatic cross-sectional view of the embodiment of FIG. 7.

FIG. 7 is a diagrammatic plan view of a fourth embodiment of a chip arrangement according to the invention. Two chips 70 and 72 are arranged in mutually opposite relationship. The illustrated chips are also suitable for an arrangement without a coupling component. The coupling elements of the signal interfaces for both chips are horizontal coils 71 and 73. They can couple by means of their horizontal magnetic fields through the mutually facing side surfaces of the chips in a horizontal direction. Therefore the chips can be easily arranged in mutually juxtaposed relationship on a carrier if they are of the same height. As such a magnetic coupling can have a greater range than a capacitive coupling, an intermediate space 75 between the chips can thereby also be more easily bridged. The structure of the coils can be seen in greater detail by reference to the cross-sectional view in FIG. 8. Connected downstream of the coils are signal boosters, of which by way of example the signal booster 76 is illustrated. It can be seen from the cross-sectional view in FIG. 8 that the coils extend over a plurality of metal planes in the chips. That height of the coils means that there is a greater degree of inductance and a tolerance in relation to vertical positional inaccuracies.

Figure 9:
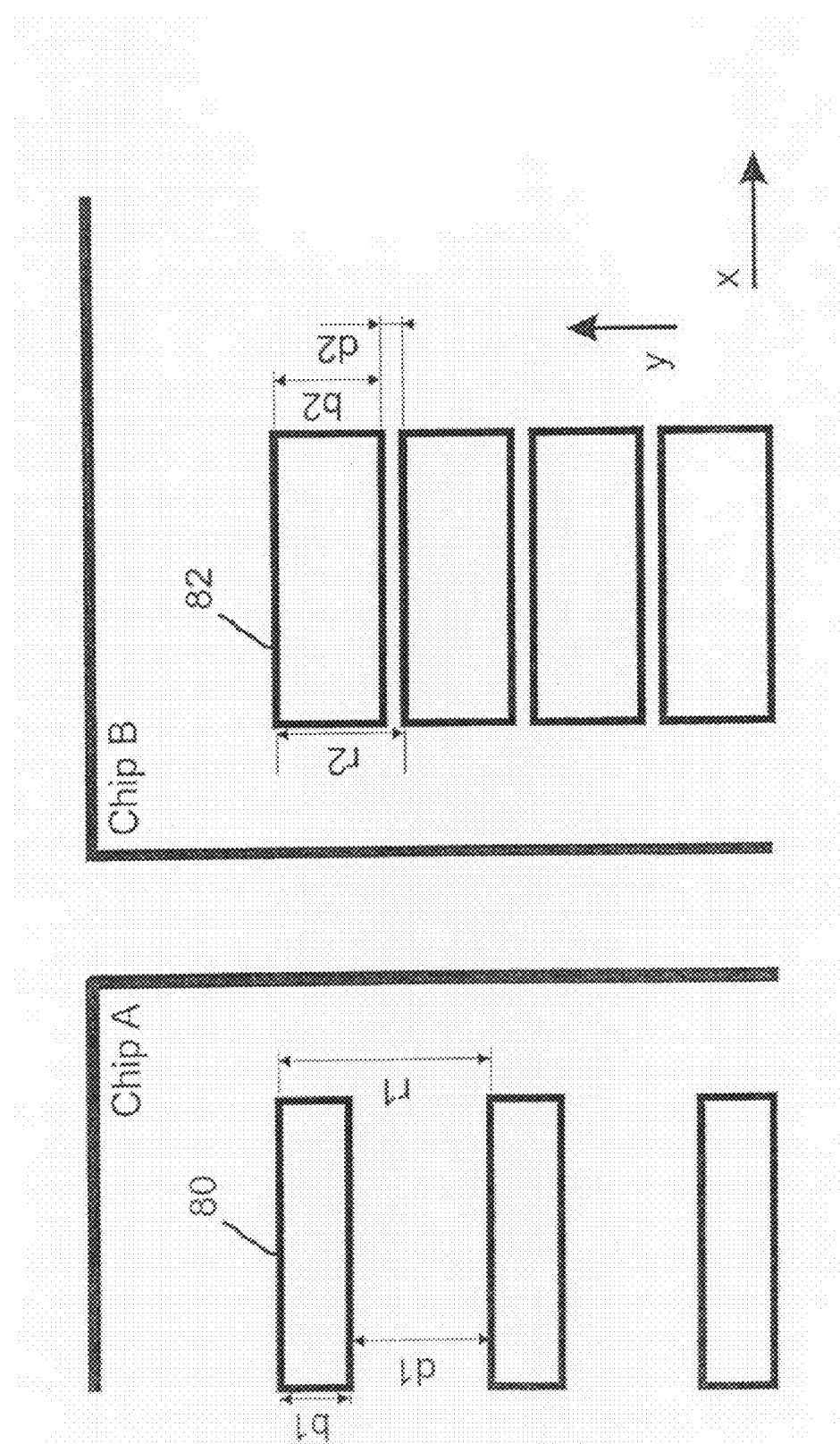
FIG. 9 is a diagrammatic view of relative dimensions of coupling elements.

FIG. 9 shows first coupling elements 80 and second coupling elements 82 by comparison, by reference to an example. The second coupling elements 82 are used for example in a signal interface of a chip or on a coupling component. They correspond in their function to the coupling elements 34 and 36 in FIGS. 1 and 2 while the first coupling elements 80 correspond to the coupling elements 20 through 30 in FIGS. 1 and 2. The diagrammatic view in FIG. 9 only serves to illustrate the ratios of width and spacing of the first and second coupling elements, by comparison, by reference to an example. The first coupling elements 80 are of a width b1 and a mutual spacing d1. The total of b1 and d1 gives a pitch r1. The second coupling elements 82 are of a width b2. That is less than the spacing d1. It will be appreciated that the width b2 can also be less than the width b1. To avoid cross-talk between the first coupling elements 80 it is important for b2 to be less than d1. In that way a displacement in the y-direction which is shown in FIG. 9 by means of an arrow pointing in the spacing direction is simplified. A strip-shaped configuration in the x-direction, which is in perpendicular relationship to the y-direction in the plane of the paper, also facilitates positioning in the x-direction.

Figure 10:
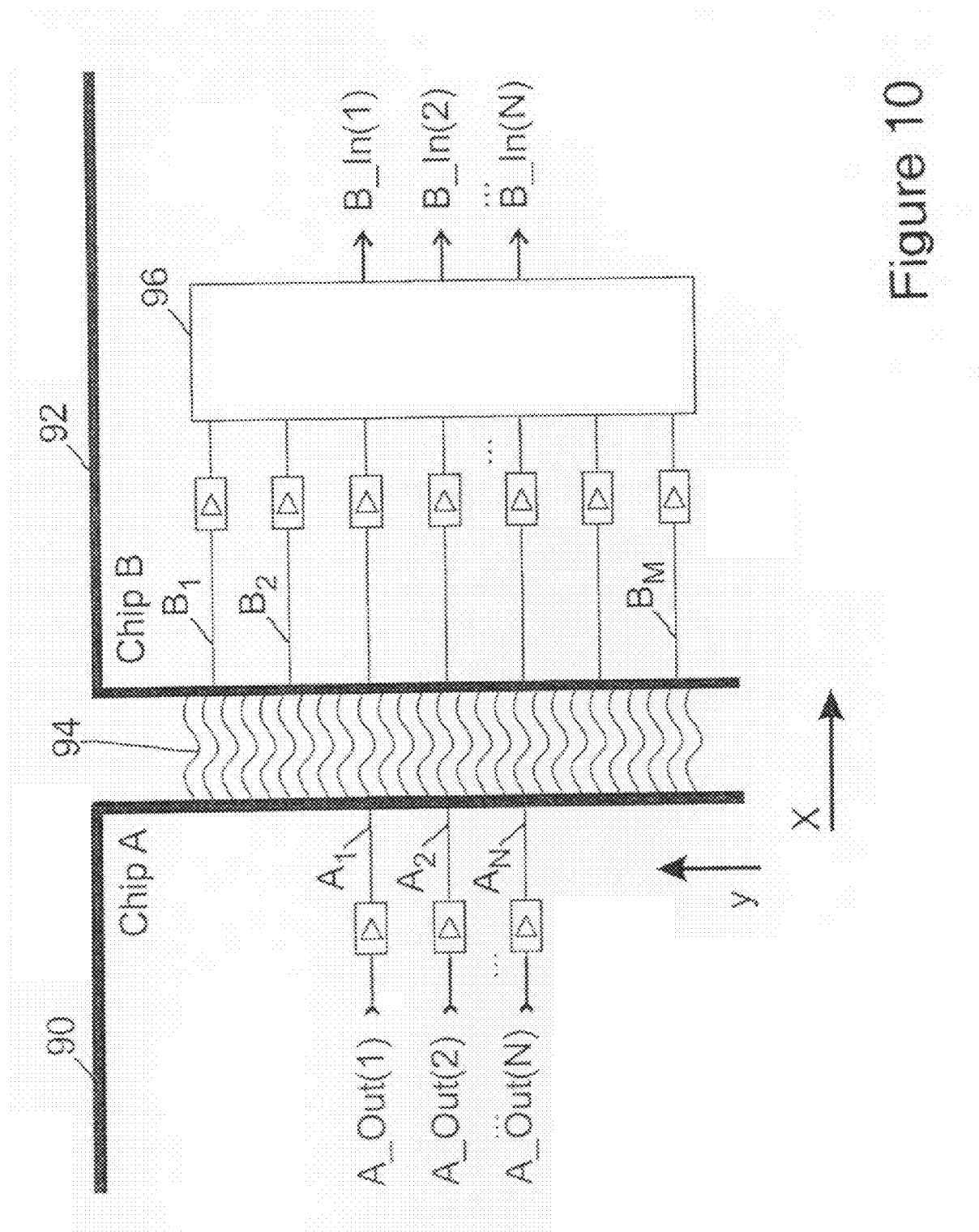
FIG. 10 is a diagrammatic plan view of a fifth embodiment of a chip arrangement which has additional coupling elements at the receiver end.

FIG. 10 shows a block circuit diagram of a chip arrangement with additional coupling elements on the part of the receiver. The chip arrangement has a first chip 90 and a second chip 92 which exchange signals by contactless coupling, by means of a coupling component 94. The coupling component 94 is only diagrammatically indicated by wavy lines in FIG. 10. They have nothing to do with its actual design configuration. The first chip 90 has a smaller number of first coupling elements $A_1$ through $A_N$. Disposed in opposite relationship thereto on the receiver side on the chip 92 are coupling elements $B_1$ through $B_M$, wherein M>N. The chip 92 has a selection circuit 96 which is adapted to ascertain by way of which of the coupling elements $B_1$ through $B_M$ the signals of the coupling elements $A_0$ through $A_N$ enter. Those N signals are outputted in parallel relationship by the selection circuit 96. For selection of the active coupling elements the selection circuit uses for example the applied signal configuration over a given time, compares it to predefined patterns and on the basis of the comparison result decides whether a coupling element is or is not active.

Figure 11:
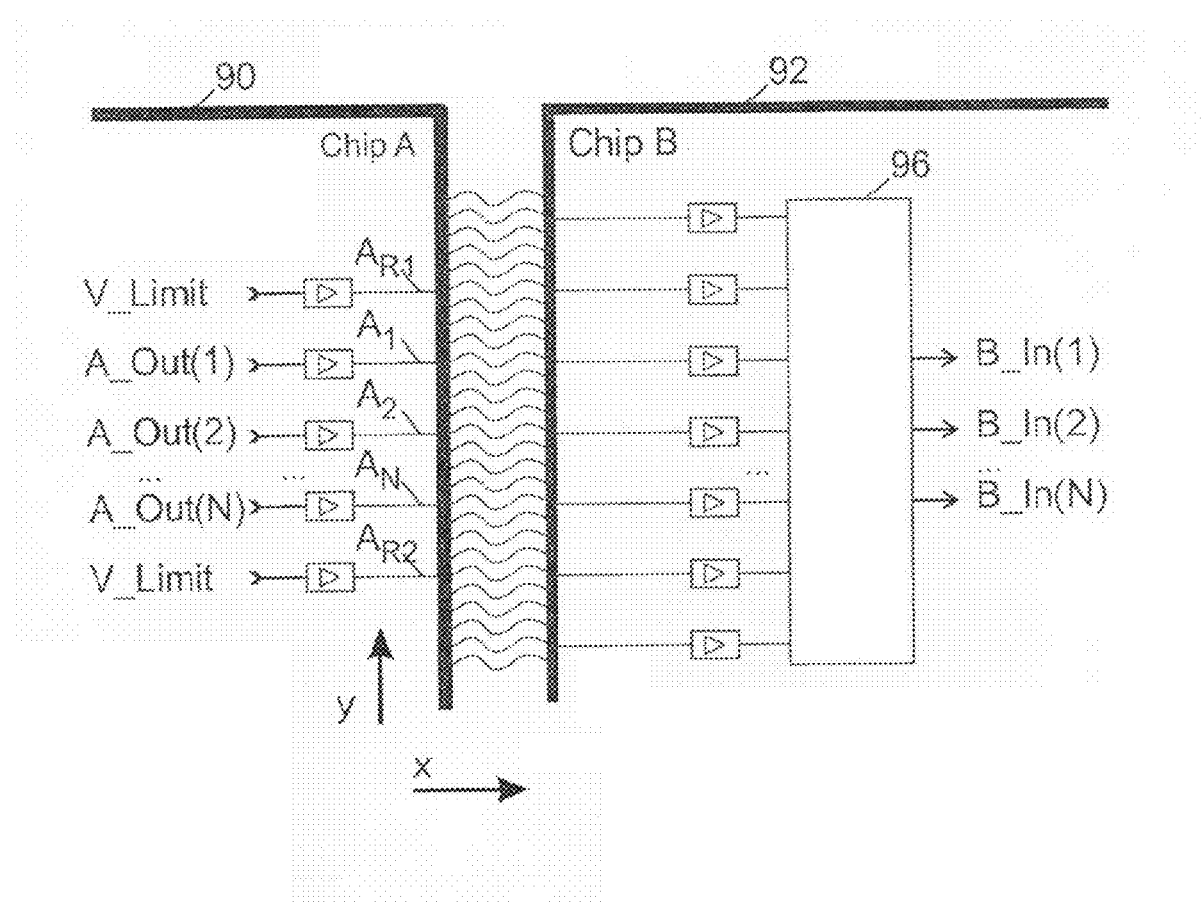
FIG. 11 shows a diagrammatic plan view of a sixth embodiment in which coupling elements are provided at the transmitter end for producing edge signals.

FIG. 11 shows a similar arrangement with minor modifications. Here, the same references are used to denote corresponding elements, as in FIG. 10. The chip 90 which forms the transmitter side of the illustrated chip arrangement, besides the coupling elements $A_1$ through $A_N$, has two edge coupling elements $A_{R1}$ and $A_{R2}$. The chip 90 is adapted to transmit given recognition signals by way of the coupling elements $A_{R1}$ and $A_{R2}$ in order to uniquely identify the edge of the signal vector $A_1$ through $A_N$. The recognition signal can be for example a level change with a given phase position relative to the level changes of all other coupling elements. Such a signal is identified at V_Limit in FIG. 11. The selection circuit 96 on the chip 92 is adapted here to detect the edge recognition signals. Coupling elements on the receiver side, which are disposed in the y-direction towards the chip edge beyond the coupling elements, by way of which the edge recognition signals are received, are deactivated by the selection circuit 96.

Figure 12:
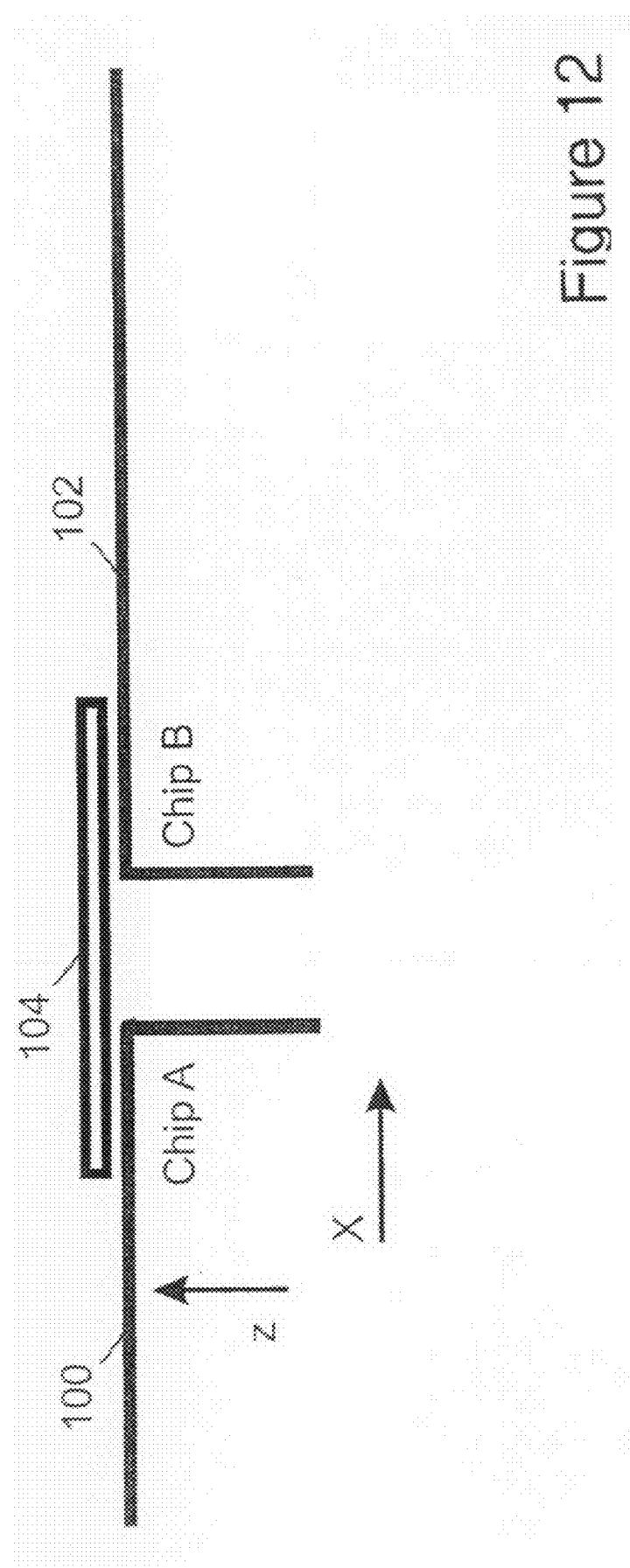
FIG. 12 is a diagrammatic cross-sectional view of a seventh embodiment of a chip arrangement having a coupling component.
Figure 13:
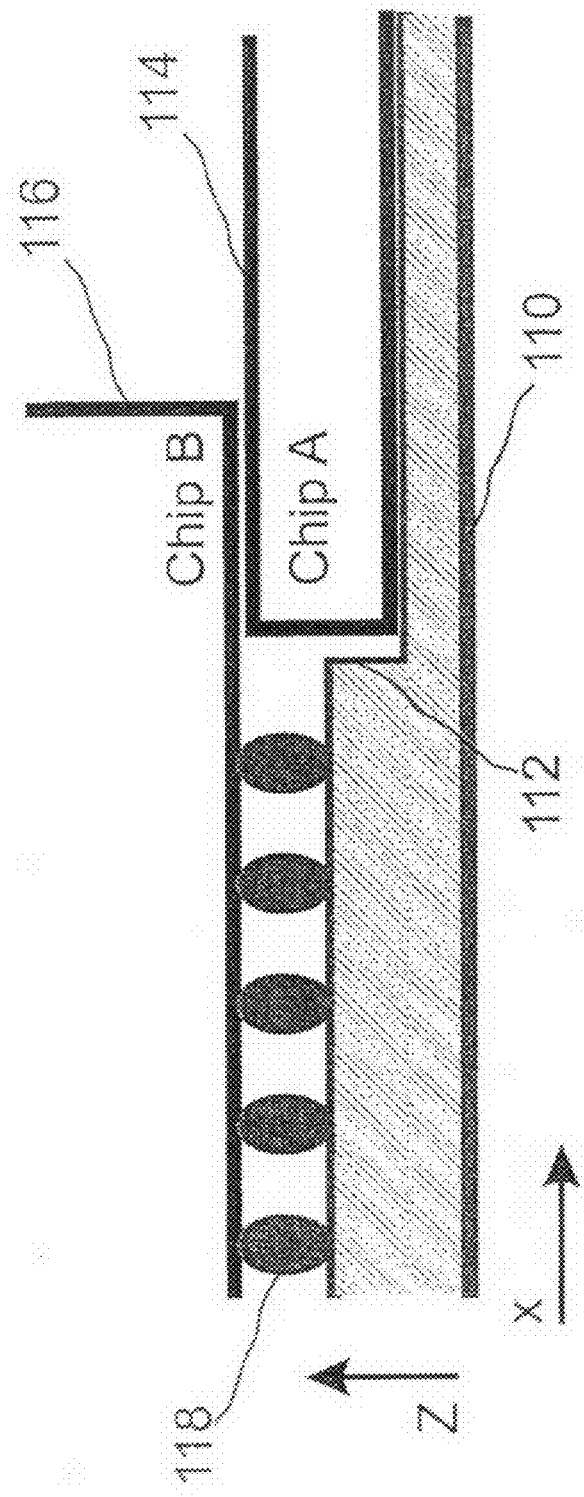
FIG. 13 is a diagrammatic cross-sectional view of an eighth embodiment in a flip chip arrangement.
Figure 14:
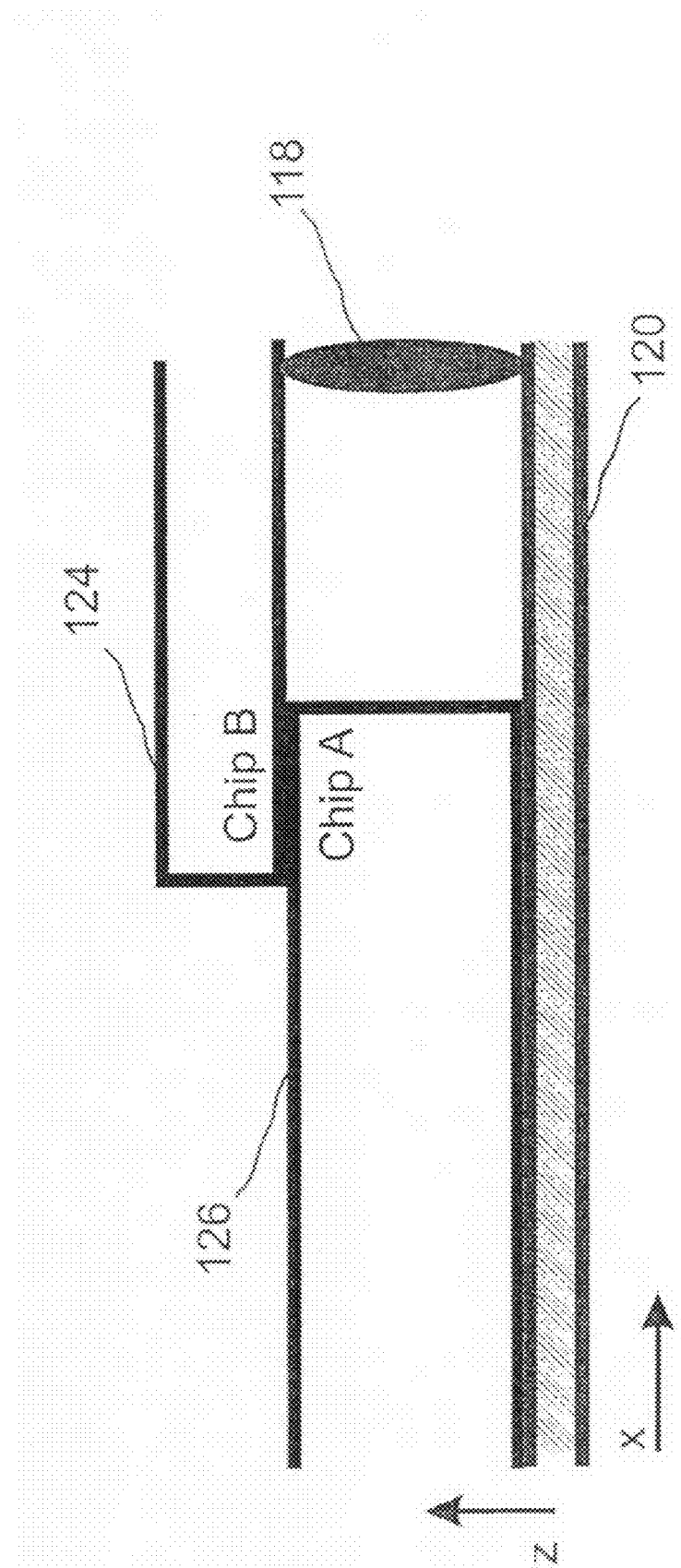
FIG. 14 shows a ninth embodiment in a further clip chip arrangement.

FIGS. 12 through 14 show further different embodiments of the chip arrangement according to the invention. The chip arrangement shown in FIG. 12 corresponds to that of FIG. 2. A first chip 100 and a second chip 102 are coupled together by means of a coupling component 104, here in the form of a bridge, for contactless signal exchange. The bridge 104 lies on the edges of the chips 100 and 102. A dielectric (not shown here) can be used to enhance capacitive coupling.

The arrangement in FIG. 12 can also be turned over so that the bridge is beneath the two chips 100 and 102 and the two chips rest on the bridge. In that case the bridge 104 can also form a part of a carrier or also the entire carrier which extends over the entire length of the chips in the x-direction in FIG. 11.

Signal interfaces however have to be provided on the bridge only where the signal interfaces of the chips 100 and 102 are to be coupled together.

In the arrangement in FIG. 12 the chips must be well matched in the z-direction so that the bridge can rest substantially flat thereon. That arrangement is moreover advantageous if both chips have further terminals which are to be contacted by bond wires.

FIGS. 13 and 14 show alternative configurations of a chip arrangement according to the invention in which it is possible to dispense with a coupling component. Here, a respective one of the chips is provided with a second signal interface in accordance with the present invention. In the chip arrangement of FIG. 13 a carrier 110 is provided with a step 112 against which a first chip 114 is applied. A second chip 116 is laid on the first chip 114 in such a way that it covers it over only in the region of the signal interfaces. The signal interface of the chip 116 is provided in facing relationship with the chip 114 on the underside. The chip 116 resting on the chip 114 extends in the x-direction beyond the step 112 and is supported and contacted by what are referred to as bumps 118. The thickness of those contacting elements 118 must be matched to the height of the chip 114 and take account of the step 112.

FIG. 14 shows a similar form of 'flip chip coupling' in which however there is a carrier 120 without steps. In this arrangement the contacting elements 118 must alone provide for heightwise matching n the z-direction. Vertical matching is simple if the upwardly disposed chip 124 has on its underside, besides the signal interface according to the invention, only few contact elements which are to be electrically conductingly contacted. That can be the case for example if the upwardly disposed chip 126 is a memory chip which, in addition to contactless coupling with the chip 126, only requires a voltage supply. As only very few contact elements are to be contacted here, they can be designed to have a very large surface area. For example they can be arranged in a single row and of such a dimension that at the same time they serve for heightwise compensation, as indicated in FIG. 14.

Figure 15:
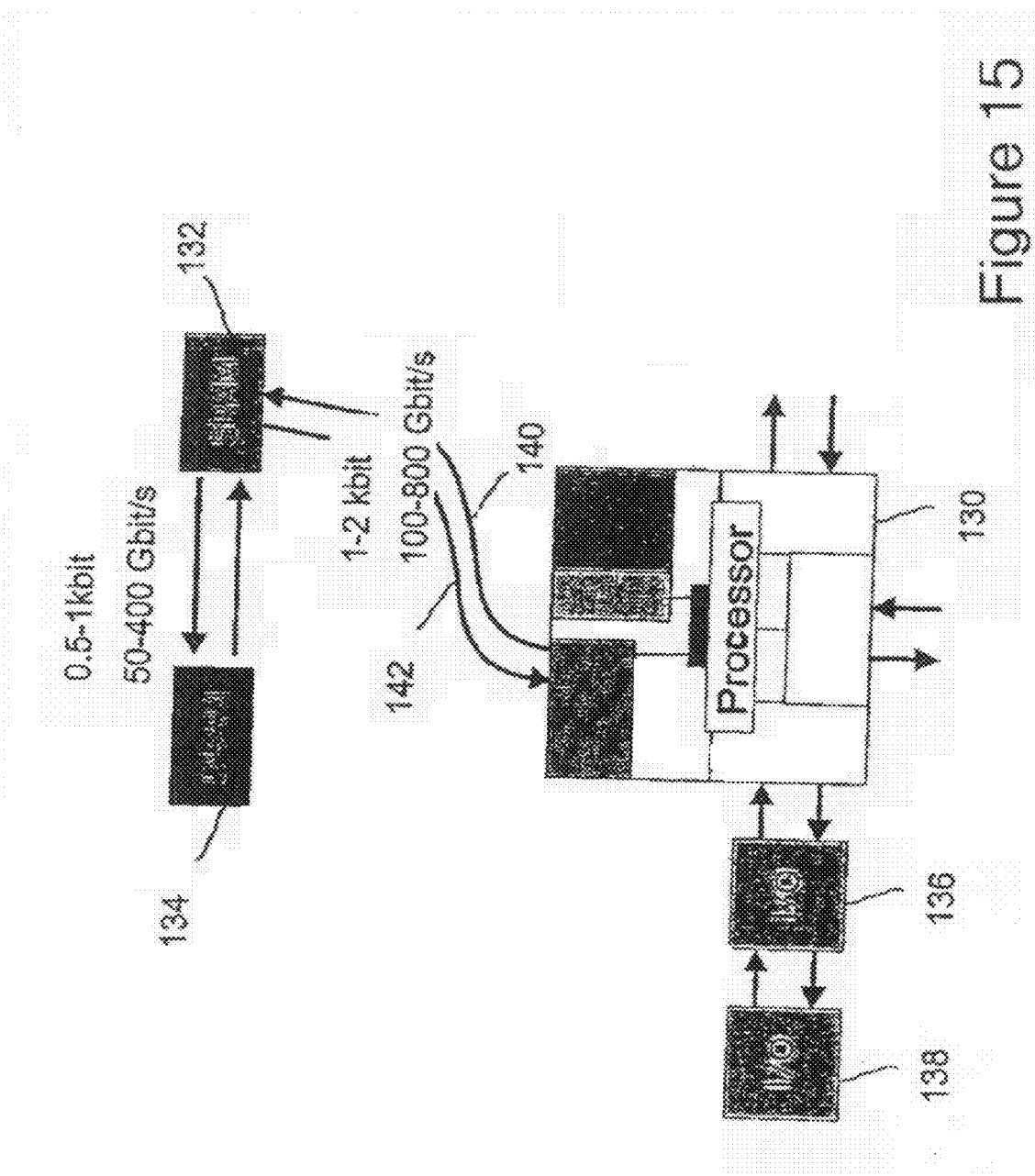
FIG. 15 shows an example of use of the chip arrangement according to the invention.

FIG. 15 shows an example of use of the chip arrangement according to the invention. The arrangement illustrated here includes a microprocessor 130, an SRAM component 132, a DRAM component 134 as well as input/output components 136 and 138. The microprocessor 130 and the SRAM component 132 are connected together by way of a signal interface according to the invention. That is illustrated in the present case by arrows 140 and 142. That affords an interface between the microprocessor 130 and the fast memory component 132 which thus, from the point of view of the parameters access time and access magnitude, is between the power of an internal cache and an external main memory on a motherboard. In comparison with previous solutions which only have memories 'on-chip' or 'on-board', that solution is somewhat more costly. The costs however become acceptable when that eliminates a bottleneck which reduces the computing power of the overall system in essential uses to a fraction. Then the action of the memory expansion achieved with the chip arrangement according to the invention corresponds to a multiplication of the clock rate of the processor.

Establishment of the high-density interface proposed here in the form of a standard means that in the longer term it is even possible to achieve a reduction in costs with at the same time an increase in power, insofar as a large part or even the entire DRAM memory is integrated in a chip arrangement according to the present invention in a module and DRAM and SRAM share the bandwidth to the processor. This means that the processor 130 will already contain substantial amounts of main memory in the module.

The contactless data transmission system proposed here can therefore be expanded from a connection between two chips of a module to a modularly expandable connecting structure of a number of chips. In that case each chip can be a regeneration stage and driver for forwarding the signals to the next chip. Admittedly that means that the latency time increases with the distance from the processor. However advantages are still to be expected in consideration of the very high data rate and the low latency per stage. The complicated and expensive methods used in the state of the art for stably achieving a high data rate to the DRAM component can then be dropped or simplified. For, in a module according to the chip arrangement according to the invention, the conditions are more relaxed in consideration of the short distance and the low levels of parasitic capacitance. Higher circuitry demands on the basis of increased attenuation than in the case of directly electrically conducting contacts do not give rise to any problems in principle. They are also of subordinate significance in regard to the design complication and expenditure and the chip area required for that purpose when large numbers of items are involved.

Figure 16:
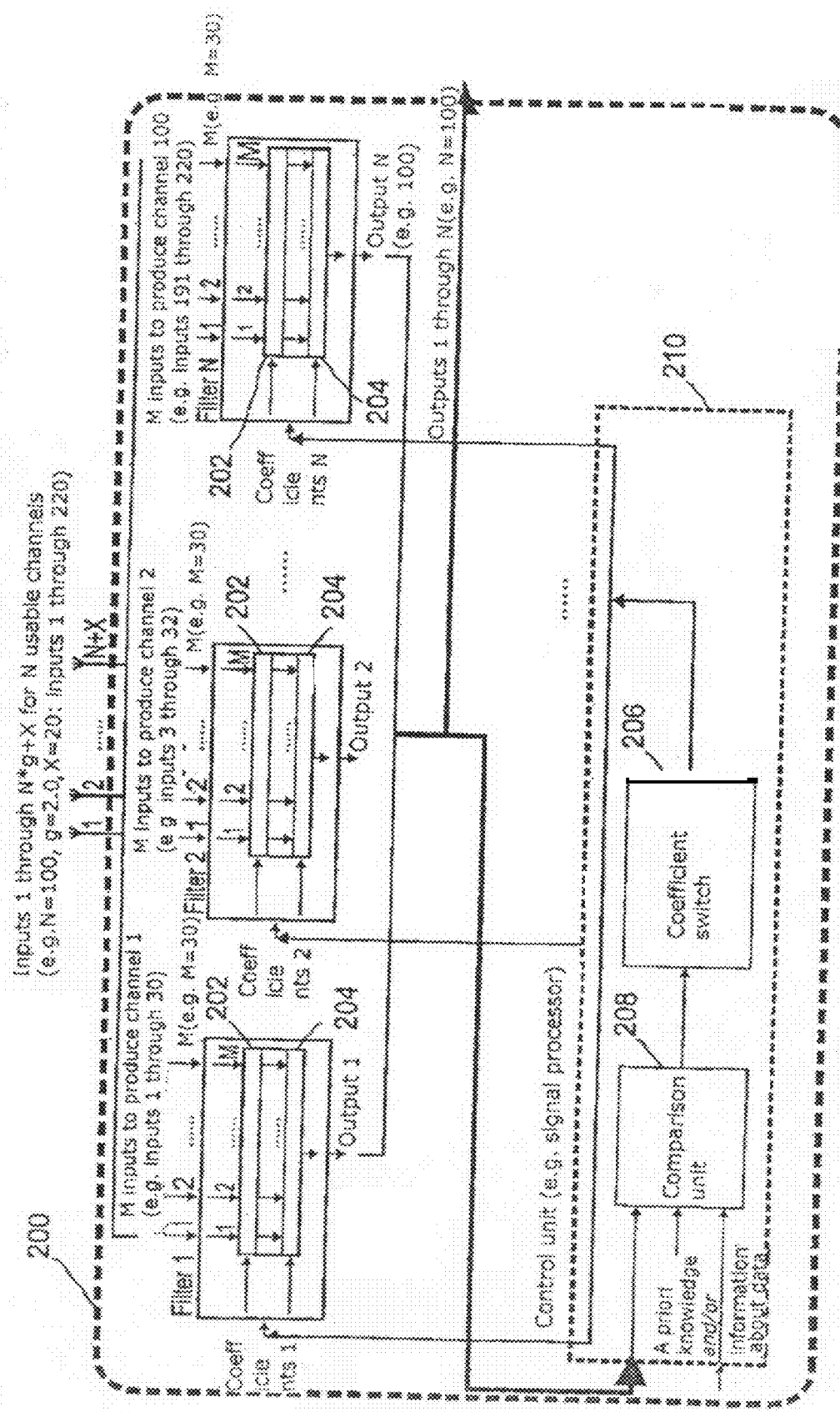
FIG. 16 shows a simplified block circuit diagram of a circuit at the receiver end for signal processing.

FIG. 16 shows a simplified block circuit diagram of a circuit at the receiver end for signal processing. The embodiment illustrated here is intended to serve for the transmission of N usable channels. The receiver circuit 200 in FIG. 16 has $N*g+X$ inputs for that purpose. By way of example the arrangement has 220 inputs and correspondingly 220 coupling elements, while 100 coupling elements are provided at the transmitter end. In this case the factor g is 2.0 and the number of the laterally projecting coupling elements is in total $X=20$. Connected downstream of the inputs are N filters, that is to say for example 100 filters. Each filter has a number of inputs which is denoted by M in FIG. 16. M is at least 1 and at a maximum equal to the number of the coupling elements at the receiver end, and is for example 30. Each filter has a filter bank 202 in the form of a matched filter bank, downstream of which is connected a weighting circuit 204. The filter bank has control inputs, by way of which filter coefficients can be inputted. The weighting circuit 204 also has one or more control inputs, by way of which weighting factors can be programmed. A coefficient estimator 206 is provided for determining and programming the weighting factors and filter coefficients. The coefficient estimator 206 is connected on the input side to a comparison unit 208. Both together are integrated in a control unit 201. In a first embodiment of a method of operation of the chip arrangement according to the invention firstly a selection of active inputs is made, that is to say active coupling elements, on the receiver side. For that purpose it will be assumed that, for 100 channels to be used, 220 inputs are used. The inputs of the interface of the receiver are arranged geometrically doubled as densely as the coupling elements at the transmitter end. By way of example the 100 coupling elements of the transmitter are arranged in a 10 μm pitch. Over that width the receiver has 200 coupling elements in a 5 μm pitch. In addition the receiver additionally has in each case 10, that is to say 20 channels, at the two edges of the signal interface, which can accommodate coarse displacements. There is a filter for each of the 100 channels. Each of 100 filters of the receiving circuit has M equal to 30 inputs. The filters behave in a simple example like a pure change-over switch. In other words: the filter bank forwards the signals without change. The weighting circuit 204 however combines the signals in weighted relationship. In that situation, in the simplest case, only a single filter input receives the weight 1.0. All others receive 0.0 and thus become inactive. In that case the receiver circuit only executes a spatial, that is to say geometrical, selection in respect of the optimum receiving channels. In that case 30 receiving channels are to be respectively selected for a channel to be used.

In a slightly less focussed version of that method of operation the entire weight is distributed to 1 through 3 inputs according to the respective receipt at the inputs. For example an input a receives the weighting factor 0.4, an input b the weighting factor 0.4 and an input c the weighting factor 0.2. The inputs a, b and c are arranged in spatially mutually juxtaposed relationship. In that way signals which are indistinctly distributed can be acquired on a plurality of inputs. A pure change-over switch becomes a filter. Each such filter has M inputs, for example M=30. The inputs of the receiver are distributed as uniformly as possible to the inputs of the filters. In the ideal case each filter would be displaced further towards the right by $((N*g+X-M)/N)$ than its predecessor. Ratios which possibly involve a fraction are adapted by rounding to whole numbers. For example a filter is further displaced by two inputs instead of by 1.9 inputs as by calculation. In a setting phase the 220 inputs are queried. The control unit 210 looks for known properties in the 100 signals. For that purpose it successively queries the inputs. The inputs in which the known signal properties are to be most clearly found are activated by setting the filter coefficients. As described above, a plurality of adjacent inputs can be activated for a signal, to improve reception.

After the setting phase, in the working phase of the receiving circuit the data are transmitted to the outputs by way of the set filters. In that case the quality of the data can be monitored and possibly adjusted during transmission by adaptation of the filter and weighting coefficients. Alternatively it is possible to implement a fresh setting phase.

In a second example of a method of operation each of the filters forms a rake receiver. The signal is altered by individual filters and then assembled. In that case the filter bank comprises M filters which respectively alter the signal. The output of each of those M individual filters is the weighted sum of a number of states, which preceded in respect of time, of the signal:

$$A(z) = \sum_{j=1}^{r} S(j) \cdot w(j, z)$$

wherein S(j) is a signal applied to a filter input in a time step j, r is the total number of the time steps considered, w is a weighting factor which is dependent on the respective time step j, and z is an index identifying the filter.

The individual filter characteristic of each individual filter is set by way of the r weights of each individual filter. The signal is accordingly altered in respect of its frequency components. The technically usual variant for that purpose is a shift register of the length r, which is connected to r multipliers and an adder. A multiplier and a further delay element are connected in parallel relationship downstream of each delay element of the delay line. Only the last delay member is solely connected to a multiplier. The outputs of the multipliers are connected to parallel inputs of an adder. The weighting circuit combines the M signals in weighted relationship. In that case a plurality of filter inputs can receive a weight which is not equal to 0. As described above the inputs of the receiver are distributed to the inputs of the filters.

In a setting phase the 220 inputs are queried. The control unit looks for known properties of the 100 signals. For that purpose it successively queries the 220 inputs. The filter coefficients and weighting factors are then estimated. Starting from that initial estimation, those coefficients and factors are further optimised. This involves an optimisation problem with very many degrees of freedom. To assess the quality of the signal, it is possible to provide in the comparison unit 208 correlators which compare the signal to a known pattern. The output of the correlators is a number which corresponds to a measurement in respect of the similarity of a received signal with a predetermined pattern. Algorithms such as for example a least-mean-square algorithm can be used to optimise the coefficients in the estimating unit 206 in a stepwise procedure.

In the working phase the received signals are transmitted to the outputs by way of the set filters. During operation, as described above, the quality of the data can be monitored and the coefficients possibly adjusted during the transmission. Alternatively a fresh setting phase can be implemented.

In practice what presents itself is using the two described methods of operation in hybrid fashion. It is thought that a pure signal processing method as last described would not be practicable. In contrast a pure selection of coupling elements in the receiving circuit without subsequent demixing of the signals could be a possibility. To optimise the signal-noise ratio however it would also be possible to use a plurality of inputs for a data channel.

What is claimed is:

1. A chip arrangement comprising a first chip which has at least one first signal interface with first coupling elements arranged along a first line in a first number density and at least one second chip which has at least one second signal interface with second coupling elements arranged along a second line in a second number density, wherein the first signal interface is provided along an edge of the first chip and the second signal interface is provided along an edge of the second chip, wherein the first and second coupling elements are configured to permit contactless signal transmission between the first and second signal interfaces, wherein the first and second chips are so arranged relative to each other that coupling elements of the first and the second signal interfaces can contactlessly transmit signals with each other, wherein said edges of the first and second chips are arranged in mutually facing relationship, wherein the first and second signal interfaces have a respective first and second longitudinal extent along a respective line associated with the respective one of the first and second interfaces, the longitudinal extent of at least one of the signal interfaces along the line associated therewith being greater than a length of an overlap of the two longitudinal extents, wherein said overlap is a distance which a projection of the first longitudinal extent on to the second longitudinal extent has in common with the second longitudinal extent, wherein one of the signal interfaces has a greater number density of coupling elements than the other, and wherein the coupling elements are coils whose magnetic longitudinal axes are arranged in a horizontal plane in parallel relationship with a surface of the chip.

2. The chip arrangement as set forth in claim 1, wherein the first and second coupling elements are configured to permit contactless signal transmission by means of electromagnetic, alternatively capacitive, alternatively inductive, alternatively inductive and capacitive coupling between a first and one or more second coupling elements respectively.

3. The chip arrangement as set forth in claim 1, wherein the longitudinal extent of the signal interface which has the greater number density is greater.

4. The chip arrangement as set forth in claim 1, wherein a number N2 of the coupling elements of the signal interface with the greater number density is in a ratio N2=g*N1+X to the number N1 of the coupling elements of the signal interface with the lesser number density, and wherein g is a number greater than 1 and X is the number of the coupling elements which are in overshoot longitudinal portions of the signal interface.

5. The chip arrangement as set forth in claim 1, wherein the signal interface of the chip which in a signal flow between the first and the second chips forms a receiver and is referred to subsequently as the receiver chip has coupling elements with a greater number density.

6. The chip arrangement as set forth in claim 5 comprising a filter circuit on the receiver chip, which is connected downstream of the signal interface and is configured to reconstruct signals sent from coupling elements at a transmitter end on the basis of the signals received by the coupling elements at a receiver end.

7. The chip arrangement as set forth in claim 6, wherein the filter circuit has a number of weighting elements which are respectively configured to multiply signals received by a plurality of coupling elements at the receiver end by variable weighting factors and to add the signals weighted in that way.

8. The chip arrangement as set forth in claim 1, wherein each of a plurality of the coupling elements of the receiver chip are connected to a respective plurality of the weighting elements.

9. The chip arrangement as set forth in claim 1, wherein the number of the weighting elements is equal to the number of the coupling elements provided on the transmitter chip.

10. The chip arrangement as set forth in claim 6, wherein the filter circuit has a number of filter banks, each of the filter banks being connected at its input side to a number of the coupling elements.

11. The chip arrangement as set forth in claim 10, wherein each of the filter banks has a number of filters, and wherein each of the filters is connected on its input side to a respective one of the coupling elements.

12. The chip arrangement as set forth in claim 11, wherein each of the filters has a filter input and is configured to deliver an output signal which depends on a weighted sum of the current signal and its filter input and a number of signals at its filter input which signals preceded the current signal in respect of time.

13. The chip arrangement as set forth in claim 10, wherein each of the filters is configured to determine its output signal A in accordance with the following formula:

$$A(z) = \sum_{j=1}^{r} S(j) \cdot w(j, z)$$

wherein S(j) is the signal at the filter input in a time step j, r is a total number of the time steps considered, w is a weighting factor depending on the respective time step j and z is an index identifying the filter.

14. The chip arrangement as set forth in claim 13,
wherein the filter has a signal delay line with r delay elements, r multipliers and one adder,
wherein one of the multipliers and one of the delay elements are connected in parallel relationship downstream of each except the last delay element,
wherein solely one of the multipliers is connected downstream of the last delay element, and
wherein the outputs of the multipliers are connected to parallel inputs of the adder.

15. The chip arrangement as set forth in claim 11, wherein the weighting element is included in each of the filter banks.

16. The chip arrangement as set forth in claim 10, further comprising a control unit, which is connected to the filter banks and which is configured to subject, in a training phase, the signals applied to the coupling elements of the receiver chip to a correlation with one or more known signal patterns and to determine the weighting factors on the basis of the correlation result.

17. The chip arrangement as set forth in claim 1, wherein the transmitter chip has a transmitting circuit which has complementary CMOS transistors.

18. The chip arrangement as set forth in claim 1, wherein one of the first or second chip is a microprocessor and the other is a memory chip.

19. The chip arrangement as set forth in claim 1, wherein the first or the second coupling elements are metallic electrically conductive strips arranged in mutually parallel relationship.

20. The chip arrangement as set forth in claim 19, wherein the strips have a strip width and are arranged with an equal spacing between mutually neighboring strips, and wherein a sum of the spacings of the mutually neighboring strips and of the strip width is between 1 and 25 micrometers.

21. The chip arrangement as set forth in claim 1, wherein the first coupling elements, alternatively the second coupling elements, alternatively the first and second coupling elements, are covered by an insulating layer.

22. The chip arrangement as set forth in claim 1, having a reference edge for positioning in manufacturing of the chip arrangement.

* * * * *